US012812843B2

(12) United States Patent
Srivastava et al.

(10) Patent No.: US 12,812,843 B2
(45) Date of Patent: Nov. 24, 2026

(54) SACRIFICIAL POLYSILICON IN INTEGRATION OF MEMORY ARRAY WITH PERIPHERY

(71) Applicant: Micron Technology, Inc., Boise, ID (US)

(72) Inventors: Shivani Srivastava, Boise, ID (US); Russell Allen Benson, Boise, ID (US); Raghunath Singanamalla, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 495 days.

(21) Appl. No.: 18/236,544

(22) Filed: Aug. 22, 2023

(65) Prior Publication Data

US 2024/0074159 A1 Feb. 29, 2024

Related U.S. Application Data

(60) Provisional application No. 63/401,920, filed on Aug. 29, 2022.

(51) Int. Cl.
*H10B 12/00* (2023.01)

(52) U.S. Cl.
CPC ........... *H10B 12/485* (2023.02); *H10B 12/05* (2023.02); *H10B 12/482* (2023.02)

(58) Field of Classification Search
CPC .............................. H10B 12/485; H10B 12/09
See application file for complete search history.

(56) References Cited

U.S. PATENT DOCUMENTS

| | | | | |
|---|---|---|---|---|
| 5,162,884 | A | 11/1992 | Liou | |
| 2006/0017110 | A1 | 1/2006 | Adetutu et al. | |
| 2008/0273410 | A1* | 11/2008 | Goswami | H10W 20/045 257/E27.084 |
| 2012/0070944 | A1 | 3/2012 | Kim et al. | |
| 2016/0027795 | A1 | 1/2016 | Jung et al. | |
| 2019/0027487 | A1* | 1/2019 | Chen | H10B 43/40 |
| 2019/0206874 | A1* | 7/2019 | Wang | H10B 12/30 |
| 2020/0185396 | A1* | 6/2020 | Juengling | H10B 53/40 |

(Continued)

FOREIGN PATENT DOCUMENTS

| | | | |
|---|---|---|---|
| CN | 117641905 | 3/2024 | |
| CN | 117641906 | 3/2024 | |
| KR | 20110025472 A * | 3/2011 | H10B 12/09 |

*Primary Examiner* — Sue A Purvis
*Assistant Examiner* — Emily Farmer
(74) *Attorney, Agent, or Firm* — Schwegman Lundberg & Woessner, P.A.

(57) ABSTRACT

A variety of applications can include apparatus having a memory device with metal digit lines for various digit line contacts for a memory array in an integrated process flow of the metal lines with metal contacts of transistors in a periphery to the memory array region. In the integrated process flow, material of the metal digit lines can be used as the metal contacts to the transistors in the periphery to the memory array region. In various embodiments, a metal contact can contact a metal gate of a transistor in the periphery or contact a metal barrier region, where the metal barrier region is above and contacting the metal gate and is structured without including polysilicon. Sacrificial polysilicon can be used to protect the gate of the transistor during processing in the memory array region.

20 Claims, 13 Drawing Sheets

(56) References Cited

U.S. PATENT DOCUMENTS

| | | | | |
|---|---|---|---|---|
| 2021/0043579 | A1* | 2/2021 | Fumagalli ........... | H10W 20/039 |
| 2022/0093639 | A1 | 3/2022 | Song et al. | |
| 2022/0122992 | A1* | 4/2022 | Chen ...................... | H10B 12/09 |
| 2024/0074160 | A1 | 2/2024 | Srivastava et al. | |
| 2024/0074161 | A1 | 2/2024 | Benson et al. | |
| 2024/0074166 | A1 | 2/2024 | Srivastava et al. | |

* cited by examiner

SACRIFICIAL POLYSILICON IN INTEGRATION OF MEMORY ARRAY WITH PERIPHERY

PRIORITY APPLICATION

This application claims the benefit of priority to U.S. Provisional Application Ser. No. 63/401,920, filed Aug. 29, 2022, which is incorporated herein by reference in its entirety.

FIELD OF THE DISCLOSURE

Embodiments of the disclosure relate generally to memory systems, and more specifically, to memory devices and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), static RAM (SRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. Properties of memory devices can be improved by enhancements to the design and fabrication of components of the memory devices.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
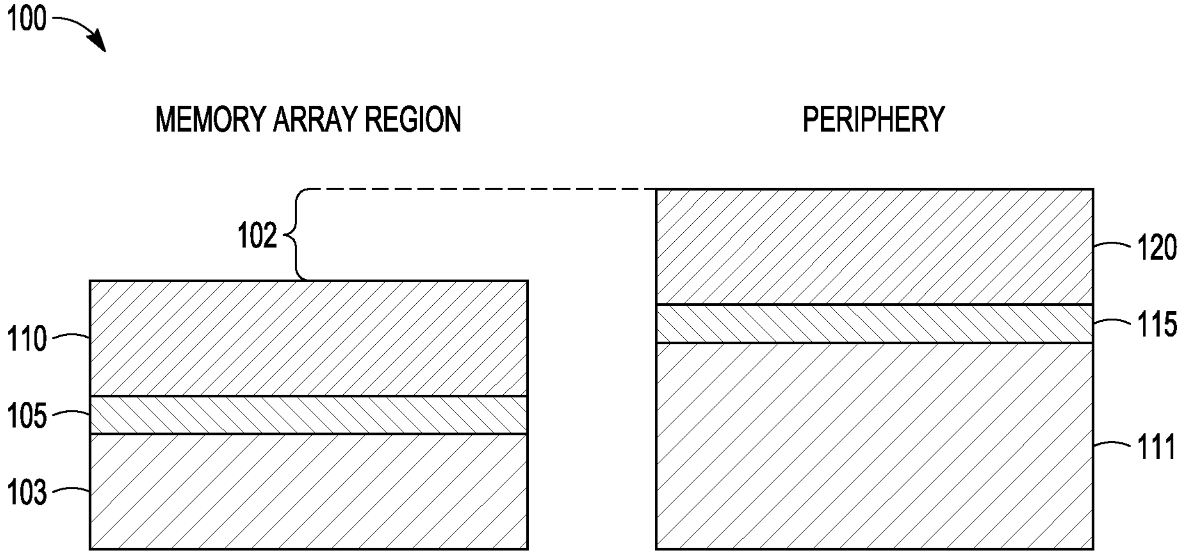
FIG. 1 illustrates portions of an architecture of a memory device having a memory array region and a periphery to the memory array region after common processing of a metal digit line in the memory array region and a metal contact in the periphery, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

Traditional process flows for memory devices, such as DRAMs, utilize the same metallization for complementary metal-oxide-semiconductor (CMOS) devices in the periphery to a memory array region and a memory array digit line in the memory array region. The same metallization, for example, can consist of barrier metals to a main conductor, where the barrier metals are designed for both CMOS devices in the periphery and the memory array. The same metallization used in traditional process flows for DRAMs in the periphery to a memory array and the memory array digit line can consist of, for example, metal barrier to a main conductor of tungsten (W), where the metal barrier includes titanium (Ti)/tungsten nitride (WN)/tungsten silicide ($WSi_x$). With respect to the metal barrier, Ti can form a titanium silicide ($TiSi_x$) layer with underlying polycrystalline silicon (polysilicon) on which the Ti is deposited, while WN protects against Ti outdiffusion to the $WSi_x$ and W layers. The $WSi_x$ serves as a template for W to form low resistivity scaling. As DRAM scales to future designs, structural characteristics between array and periphery may no longer be the same.

A memory device, such as but not limited to a DRAM device, can use transistors in the periphery region to the memory array region of the memory devices, where the structural relationship of the transistors to the memory array region can affect operation of the memory device. Typically, CMOS technology for such transistors, implementing a conventional polysilicon gate and a silicon oxynitride (SiON) gate dielectric, uses doped polysilicon for work function (WF) control with the n-type transistor and the p-type transistor of the CMOS device doped separately. The work function corresponds to a minimum amount of energy needed to remove an electron from a solid to a point in a vacuum immediately outside the solid surface.

With scaling of memory array dimensions, lower capacitance of digit lines, for example bit lines, can become critical for read/write timing associated with memory array access and for signal margin of sense amplifiers of the memory device. One approach to lower digit line capacitance is to reduce the metal conductor height of the digit line. However, with integration of fabrication processing of the memory array region and the periphery region of DRAM device, for example, the integration can be challenged due to step height difference between the memory array region and the periphery region.

In various embodiments, integrated processing of a memory array of a memory device with a periphery, such as a CMOS periphery, can be implemented with transistors formed in the periphery with metal gates, without polysilicon in a stack between the metal gate and a metal contact for the gate. The metal contact can contact the metal gate or the metal contact can contact a metal barrier region above and contacting the metal gate. The metal barrier region can be implemented by a single metal barrier region. A single metal barrier region is a region having one metal composition, which can include one or more metals and non-metals in a compound having metallic properties with respect to electrical conductivity. The metal barrier region can be implemented by multiple regions of metal compositions. Such an integrated processing, using CMOS technology, can include such transistors in the periphery realized with a high-k metal gate (HKMG).

A HKMG is a gate structure having a metal gate located on a high-k dielectric, where a high-k dielectric is a dielectric having a dielectric constant greater than that of silicon dioxide (3.7-3.9). Herein, a high-k dielectric is a dielectric having a dielectric constant greater than 3.9. The high-k dielectric in the HKMG can be located on a relatively thin layer of silicon oxide above a channel structure of a transistor. A gate located on a gate dielectric above a channel structure of a transistor along with the gate dielectric can be referred to as a gate stack. A HKMG can provide a high performance CMOS device. Use of a HKMG can avoid the use of polysilicon on the gate stack, since a WF can be determined by the dipole of WF shifters. WF shifters are elements that can be incorporated in a thin high-k dielectric, where a WF shift can be achieved by diffusing such atoms into the thin high-k dielectric to create dipoles close to the channel, shifting the WF and, hence, the threshold voltage ($V_T$) of the transistor. Structuring a metal contact directly on the gate stack or structuring a stack of barrier metals with appropriate thickness on the gate stack of transistors in CMOS devices in the periphery to the memory array of a memory device can lower overlap capacitance, which can improve alternating current (AC) performance and operational speed of the memory device. Embodiments of an integration flow without polysilicon on the gate stack can provide improved step height reduction, which can provide improved yield and cost reduction. Metals used in the memory array region and the periphery to the memory array region can be selected to lower unwanted capacitance and lower resistance of components for the memory device.

FIG. 1 illustrates portions of an architecture 100 of a memory device having a memory array region and a periphery to the memory array region after common processing of a metal digit line 110 in the memory array region and a metal contact 120 in the periphery. The metal contact 120 can be a metal contact to a transistor in the periphery, such as but not limited to a transistor in a CMOS device in the periphery. The metal digit line 110 is separated from a dielectric 103 by a single metal barrier 105 in the memory array region, while the metal contact 120 is separated from a metal gate 111 by a single metal barrier 115. Metal gate 111 can be a HKMG of a transistor, which transistor can be, but is not limited to, a p-channel MOS of a CMOS device, for example. The high-k dielectric of the HKMG can be located on a thin layer of silicon oxide.

In a non-limiting example, architecture 100 can include the periphery structure with W used as metal contact 120 and $WSi_x$ used as metal barrier 115. Metal gate 111 can be a HKMG. The memory array region of architecture 100 can include W used as metal digit line 110 and $WSi_x$ used as metal barrier 105. There is an array to periphery (A/P) step height 102 between a top level of metal digit line 110 in the memory array region and a top level of metal contact 120 in the periphery. With metal digit line 110 having a height of 14 nm, metal barrier 105 having a height of 3 nm, and dielectric 103 having a height of 10 nm in the memory array region; and with metal contact 120 having a height of 14 nm, metal barrier 115 having a height of 3 nm, and metal gate 111 having a height of 19 nm; the A/P step height 102 is 9 nm. Other heights can be implemented. With respect to some conventional architectures and processing, architecture 100 can include a structure without polysilicon above the gate structure in the periphery to the memory array region and without Ti and WN barrier metals in the memory array region and the periphery.

Metal digit line 110, which with metal barrier 105 runs on dielectric 103 at the top level of and along dielectric 103, is one of a number of digit lines on dielectric 103. With digit lines running parallel on dielectric 103, there is a digit line capacitance between digit lines. Architecture 100 provides for reduced digit line capacitance, relative to a conventional architecture, due to the reduced height of the combination of metal digit line 110 and metal barrier 105 provided by limiting the number of metal barriers between metal digit line 110 and dielectric 103 to one metal barrier.

Figure 2:
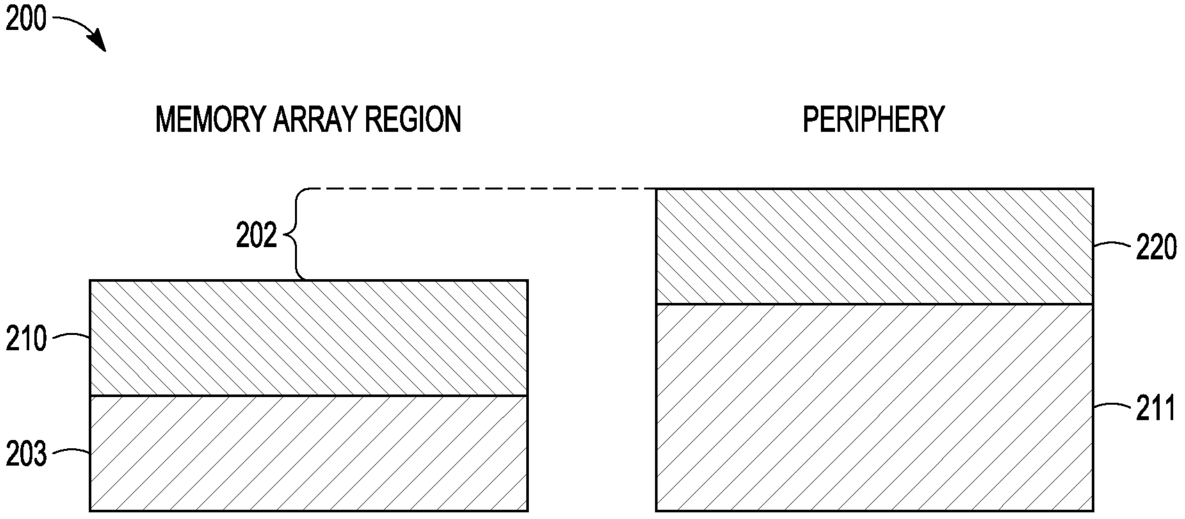
FIG. 2 illustrates portions of another architecture of a memory device having a memory array region and a periphery to the memory array region after common processing of a metal digit line in the memory array region and a metal contact in the periphery, according to various embodiments.

FIG. 2 illustrates an architecture 200 of a memory device having a memory array region and a periphery to the memory array region after common processing of a metal digit line 210 in the memory array region and a metal contact 220 in the periphery. The metal contact 220 can be a metal contact to a transistor in the periphery, such as but not limited to a transistor in a CMOS device in the periphery. The metal digit line 210 is located directly on a dielectric 203 and is not separated from dielectric 203 by a metal barrier in the memory array region, and metal contact 220 is located directly on a metal gate 211 and is not separated from metal gate 211 by a metal barrier in the periphery. Metal gate 211 can be a HKMG of a transistor, which transistor can be, but is not limited to, a p-channel MOS of a CMOS device, for example. The high-k dielectric of the HKMG can be located on a thin layer of silicon oxide.

In a non-limiting example, architecture 200 can include the periphery structure with W used as metal contact 220 and metal gate 211 can be a HKMG. The memory array region of architecture 200 can include W used as metal digit line 210. There is an A/P step height 202 between a top level of metal digit line 210 in the memory array region and a top level of metal contact 220. With metal digit line 210 having a height of 14 nm and dielectric 203 having a height of 10 nm in the memory array region; and with metal contact 220 having a height of 14 nm and metal gate 211 having a height of 19 nm; the step height 202 is 9 nm. Other heights can be implemented. With respect to some conventional architectures and processing, architecture 200 can include a structure without polysilicon above the gate structure in the periphery to the memory array region and without $WSi_x$, Ti, and WN barrier metals in the memory array region and the periphery.

Metal digit line 210 runs on the top level of and along dielectric 203 and is one of a number of digit lines on dielectric 203. With digit lines running parallel on dielectric 203, there is a digit line capacitance between digit lines. Architecture 200 provides for reduced digit line capacitance, relative to a conventional architecture, due to the reduced height of metal digit line 210 on dielectric 203 provided by directly placing metal digit line 210 on dielectric 203.

FIGS. 3-14 illustrate an embodiment of an example process flow of forming a metal conductive region to a memory array region of a memory device and to a periphery of the memory array region of the memory device, where sacrificial polysilicon is formed in the periphery to protect a gate of a transistor in the periphery during processing in the memory array region.

Figure 3:
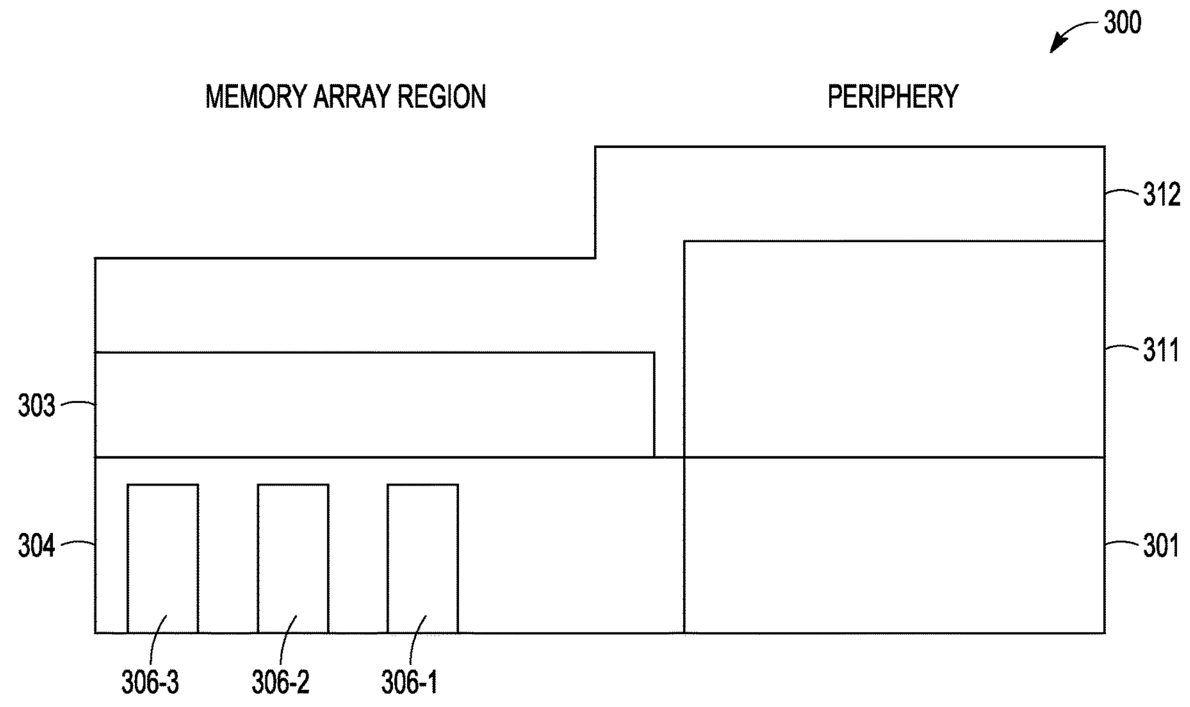
FIGS. 3-14 illustrate an example process flow for forming a metal conductive region to a memory array region of a memory device and to a periphery to the memory array region of a memory device, where sacrificial polysilicon is formed in the periphery to protect a gate of a transistor in the periphery during processing in the memory array region, according to various embodiments.

FIG. 3 illustrates a cross-sectional view of a structure 300, having a memory array region and a periphery, as an intermediate structure in forming a memory device. The memory array region includes an interlayer dielectric (ILD) 303 placed on another ILD 304, in which silicon regions 306-3, 306-2, and 306-1 are located. Though three silicon regions are shown, more or less than three silicon regions can be formed. For a memory array, such silicon regions can be significantly more in number than three. ILD 303 can include silicon oxide, such as $SiO_2$, silicon nitride, such as $Si_3N_4$, or other appropriate dielectric material. ILD 304 can be structured with dielectric materials similar to the dielectric materials of ILD 303. The periphery includes a metal gate 311 on a substrate region 301. Metal gate 311 can be a HKMG and substrate region 301 can be a silicon substrate region. Example heights for components of structure 300 can include, but are not limited to, ILD 303 having a height of 5-20 nm and metal gate 311 having a height of 15-25 nm. Metal gate 311 can include titanium nitride (TiN). The TiN can be structured as a top region of metal gate 311.

Sacrificial polysilicon 312 has been formed on the surfaces of the memory array region and the periphery to the memory array region. For example, in the periphery, sacrificial polysilicon 312 is on and contacting metal gate 311 and, in the memory array region, sacrificial polysilicon 312 is on and contacting ILD 303. Sacrificial polysilicon 312 can be formed with a thickness to provide protection to metal gate 311 during further processing in the memory array region. For example, the thickness of polysilicon 312 in the memory array region can be, but is not limited to, 5-15 nm. Structure 300 provides a starting structure for the process flow associated with FIGS. 3-14. In other embodiments, using masking and removal processing, sacrificial polysilicon can be formed on metal gate 311 without forming sacrificial polysilicon on ILD 303.

Figure 4:
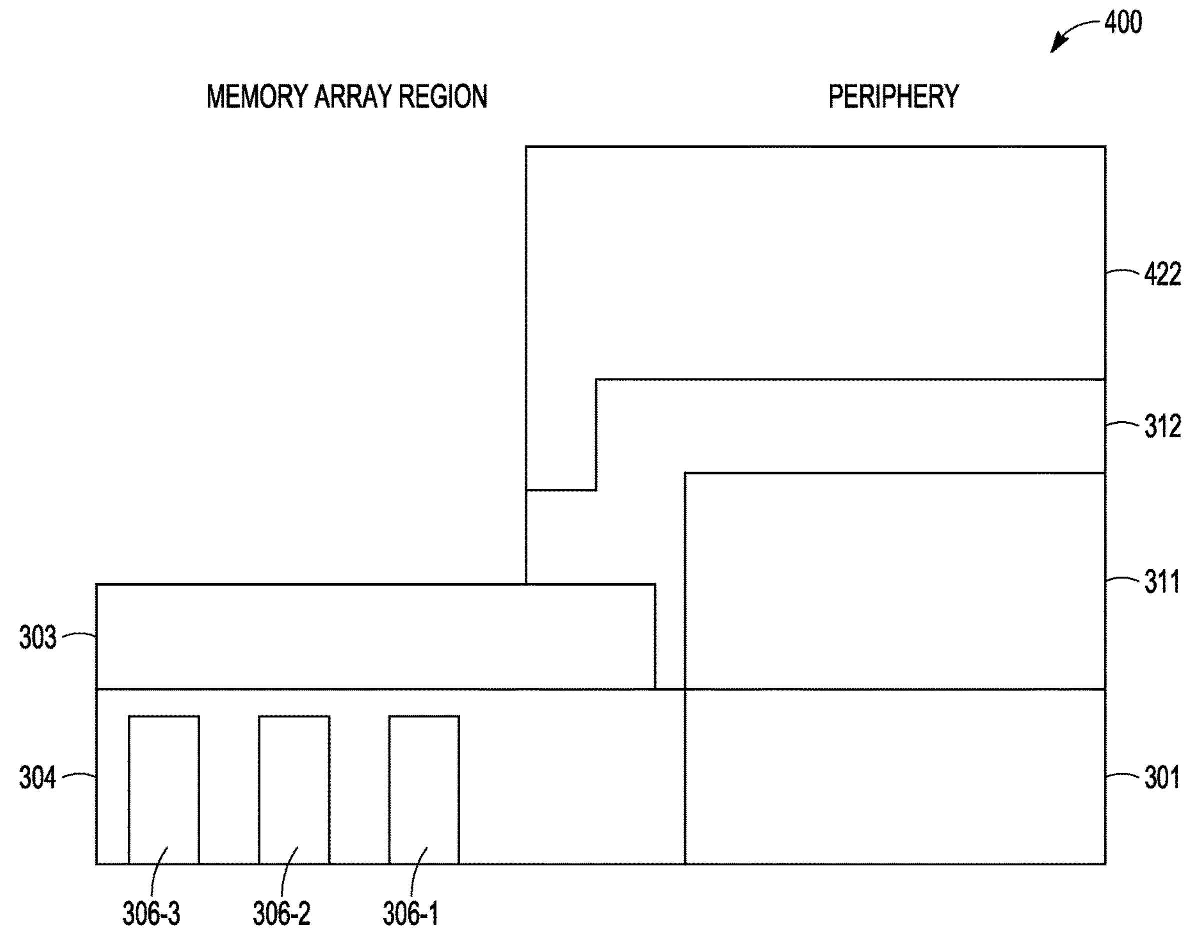

FIG. 4 illustrates a cross-sectional view of a structure 400, having a memory array region and a periphery, after processing structure 300 of FIG. 3. A photoresist 422 has been patterned in the periphery that covers polysilicon 312. Using photoresist 422, portions of polysilicon 312 that were located in the memory array region on ILD 303 have been removed.

Figure 5:
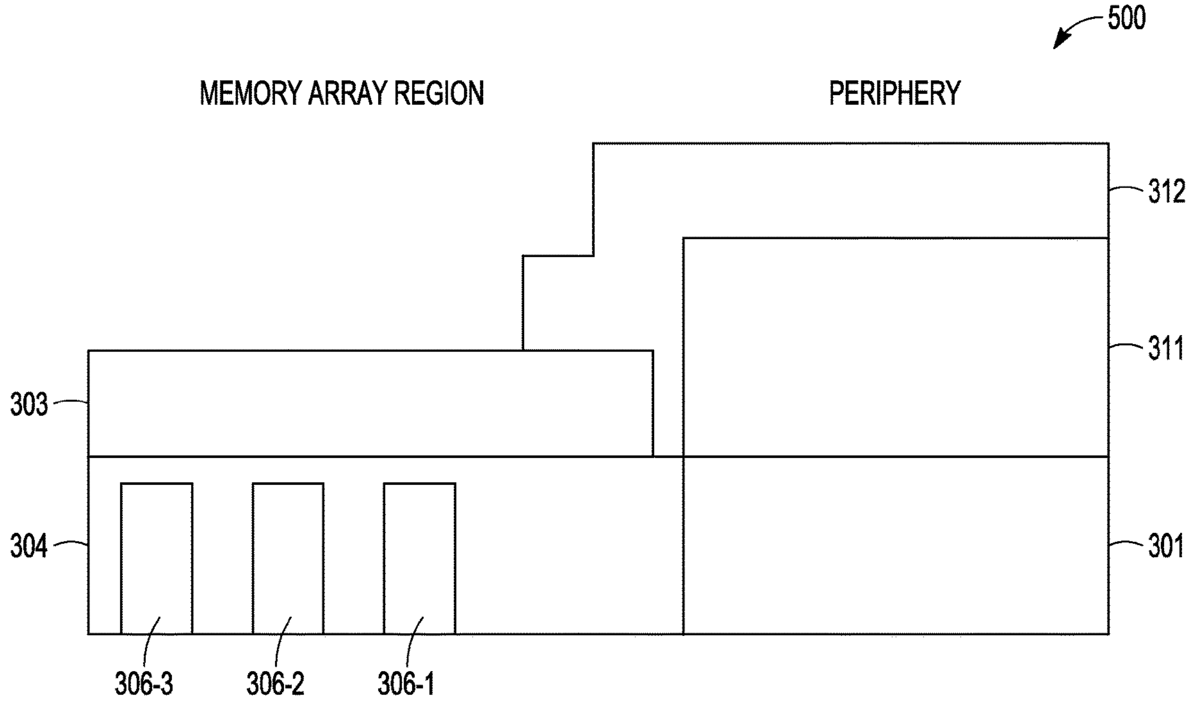

FIG. 5 illustrates a cross-sectional view of a structure 500, having a memory array region and a periphery, after processing structure 400 of FIG. 4. Photoresist 422 has been removed from above metal gate 311 in the periphery.

Figure 6:
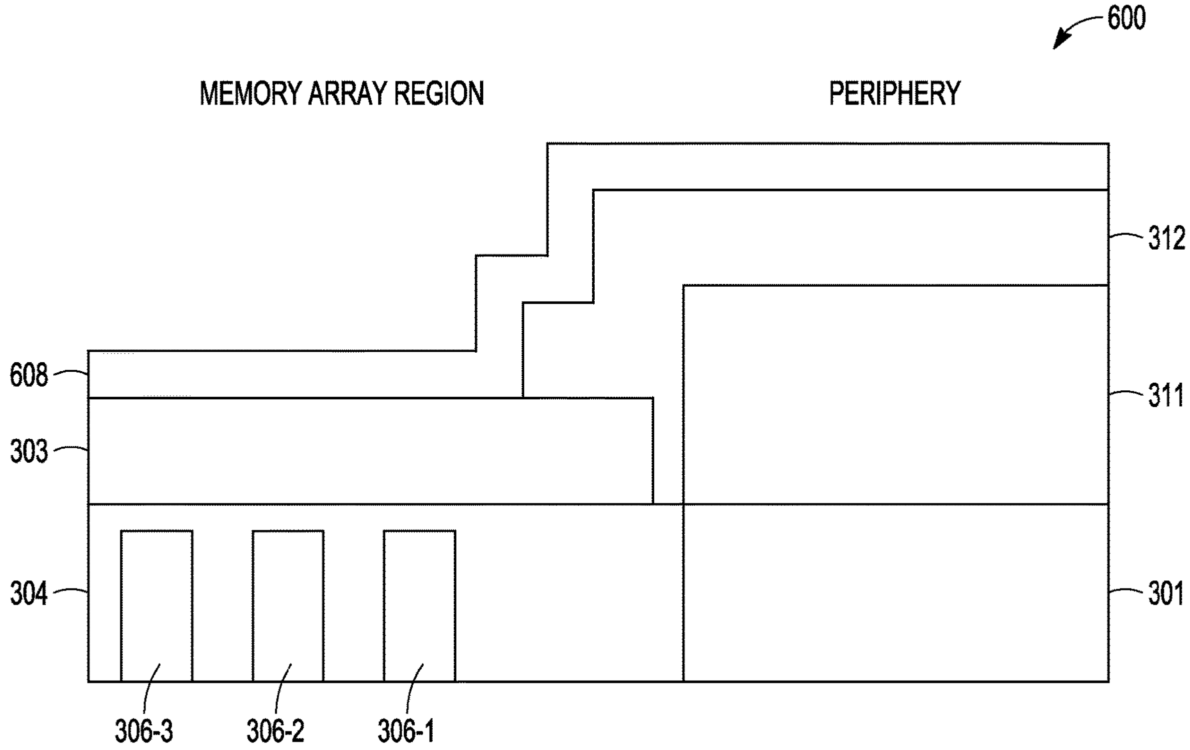

FIG. 6 illustrates a cross-sectional view of a structure 600, having a memory array region and a periphery, after processing structure 500 of FIG. 5. An ILD 608 has been formed on ILD 303 in the memory array region and on polysilicon 312 in the periphery. ILD 608 can be a silicon oxide region, a silicon nitride region, or other suitable dielectric. ILD 608 can be formed using an appropriate deposition technique suitable for the dielectric formed for ILD 608. ILD 608 can be formed having a thickness from about 10 nm to 20 nm. ILD 608 can be formed having other thicknesses. ILD 608 provides an ILD protection for further processing.

Figure 7:
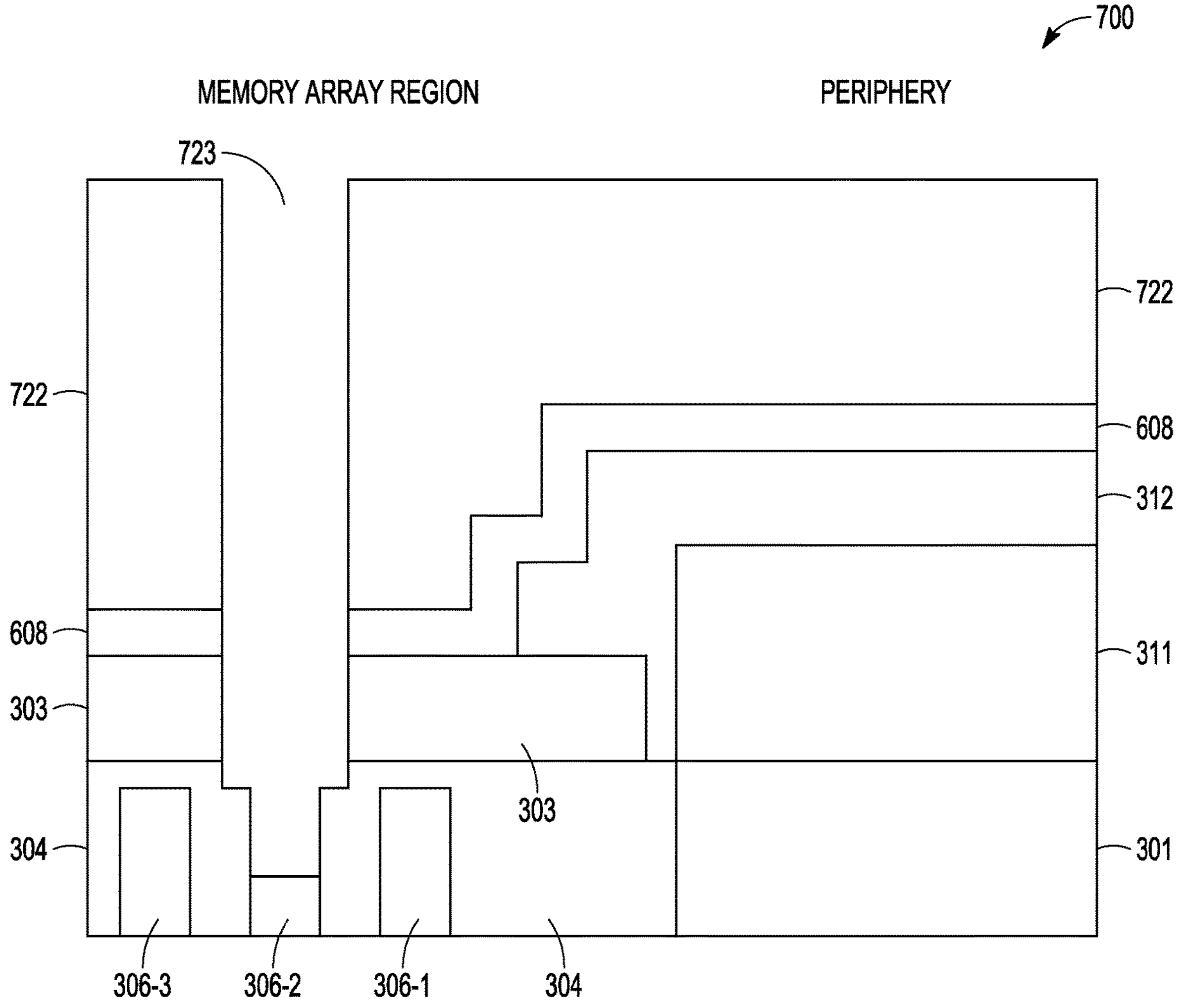

FIG. 7 illustrates a cross-sectional view of a structure 700, having a memory array region and a periphery, after processing structure 600 of FIG. 6. A photoresist 722 has been formed on ILD 608 in the memory array region and in the periphery. Photoresist 722 has been patterned to allow for forming opening to selected silicon regions for patterning digit line contacts. In FIG. 7, silicon region 306-2 has been selected such that an opening 723 has been formed through ILD 608, ILD 303, and ILD 304 exposing silicon region 306-2 for subsequent formation of conductive materials for a digit line contact to silicon region 306-2. Though not shown, the pattern corresponding to an array of digit line contacts can include a number of other silicon regions partially etched with an opening above the silicon regions. The surfaces of opening 723 can have been cleaned for further processing. Photoresist 722 can be laid in the memory array region and the periphery to the memory array region using an appropriate technique suitable for the photoresist material used.

Figure 8:
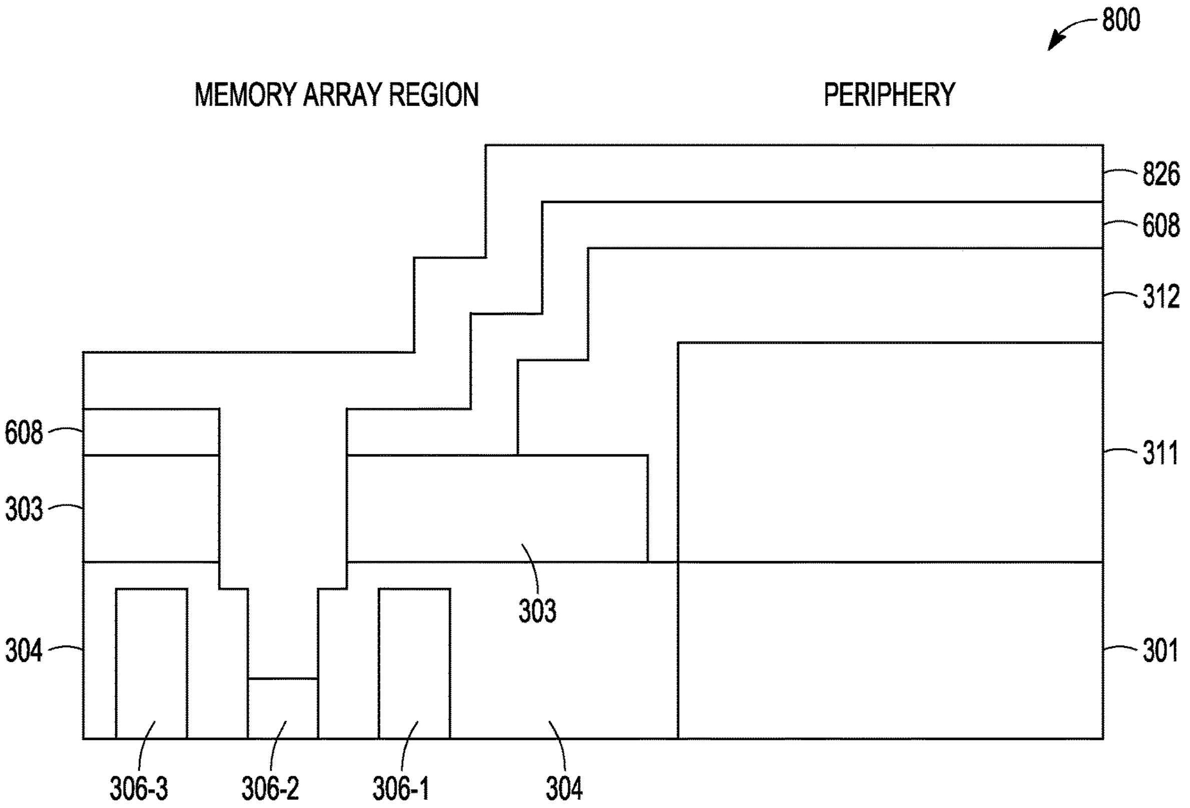

FIG. 8 illustrates a cross-sectional view of a structure 800, having a memory array region and a periphery, after processing structure 700 of FIG. 7. Photoresist 722 has been removed and polysilicon 826 has been formed on the surface of ILD 608 in the memory array region and in the periphery and filling opening 723 above silicon region 306-2 of structure 700. Polysilicon 826 can be formed using an appropriate deposition technique suitable for depositing polysilicon on the surfaces of ILDs and surfaces within openings. Portions of polysilicon 826 will only remain in digit line contacts in the memory array region at the completion of the process flow associated with FIGS. 3-14.

Figure 9:
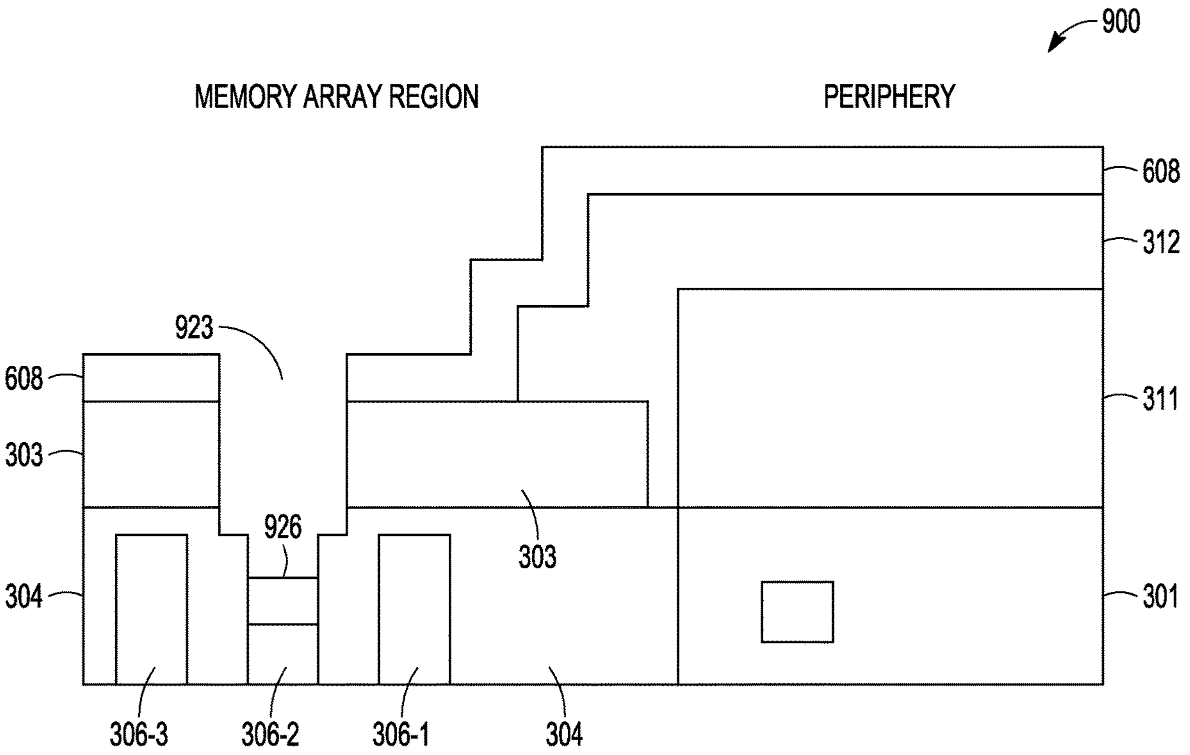

FIG. 9 illustrates a cross-sectional view of a structure 800, having a memory array region and a periphery, after processing structure 800 of FIG. 8. Polysilicon 826 in structure 800 has been etched back, leaving a polysilicon plug 926 on silicon region 306-2. Top surfaces of ILD 608 and side surfaces of ILDs 608, 303, and 304 of formed opening 923 are exposed for further processing.

Figure 10:
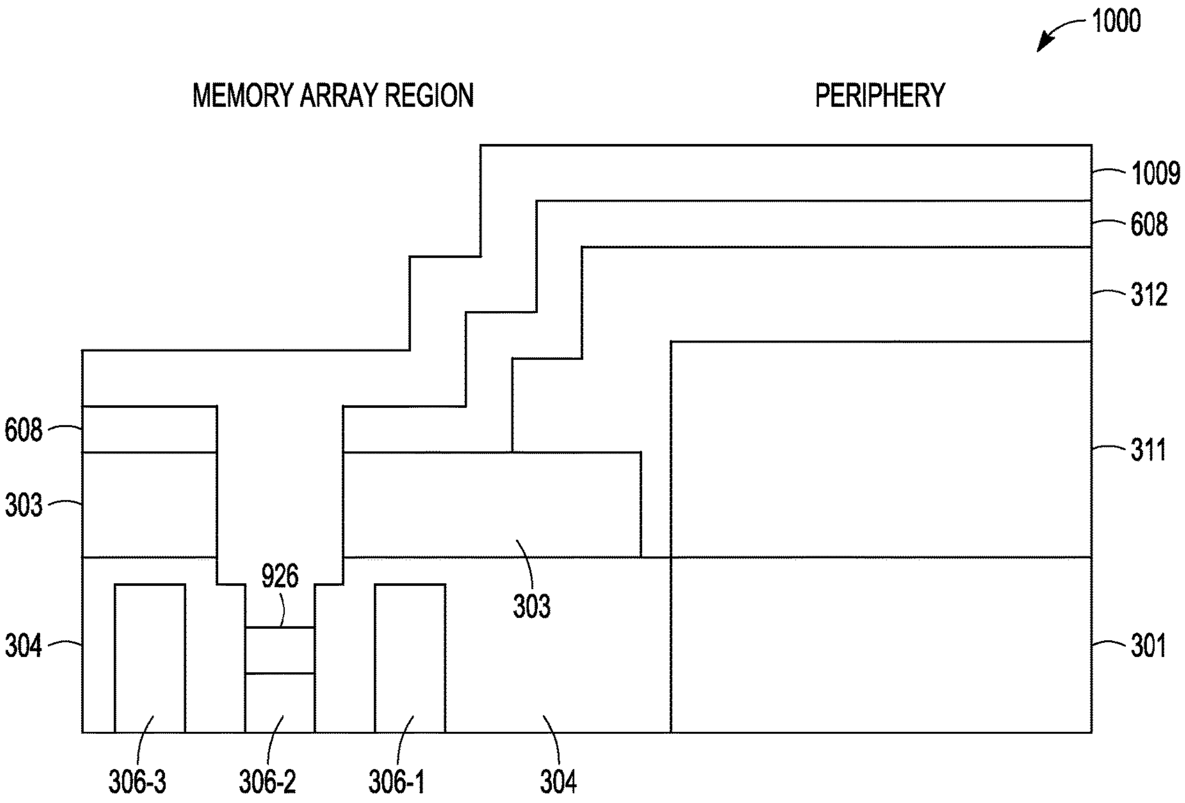

FIG. 10 illustrates a cross-sectional view of a structure 1000, having a memory array region and a periphery, after processing structure 900 of FIG. 9. A metal barrier 1009 has been formed on the surfaces of structure 900 including on the top surface of ILD 608, side surfaces of ILDs 608, 303, and 304 that defined opening 923, and on surface of polysilicon plug 926. Opening 923 has been filled with metal barrier 1009. Portions of metal barrier 1009 are to be used as barrier metals in the memory array metalization. Metal barrier 1009 can be formed by a suitable process such as by a deposition process including but not limited to physical vapor deposition (PVD), chemical vapor deposition (CVD), atomic layer deposition (ALDI), or other deposition process.

Other processes can be used. Metal barrier 1009 can include multiple metals such as, but not limited to, WN and Ti along with TiN or W. Metal barrier 1009 can be formed as a Ti barrier metal on the surfaces of structure 900 with a WN barrier metal on the Ti barrier metal and with TiN barrier metal or W barrier metal on the WN barrier metal. Ti, WN, TiN, and W barrier metals can each be formed as layers of barrier metals. Portions of metal barrier 1009 will only remain in the memory array region for digit line contacts at the completion of the process flow associated with FIGS. 3-14.

Figure 11:
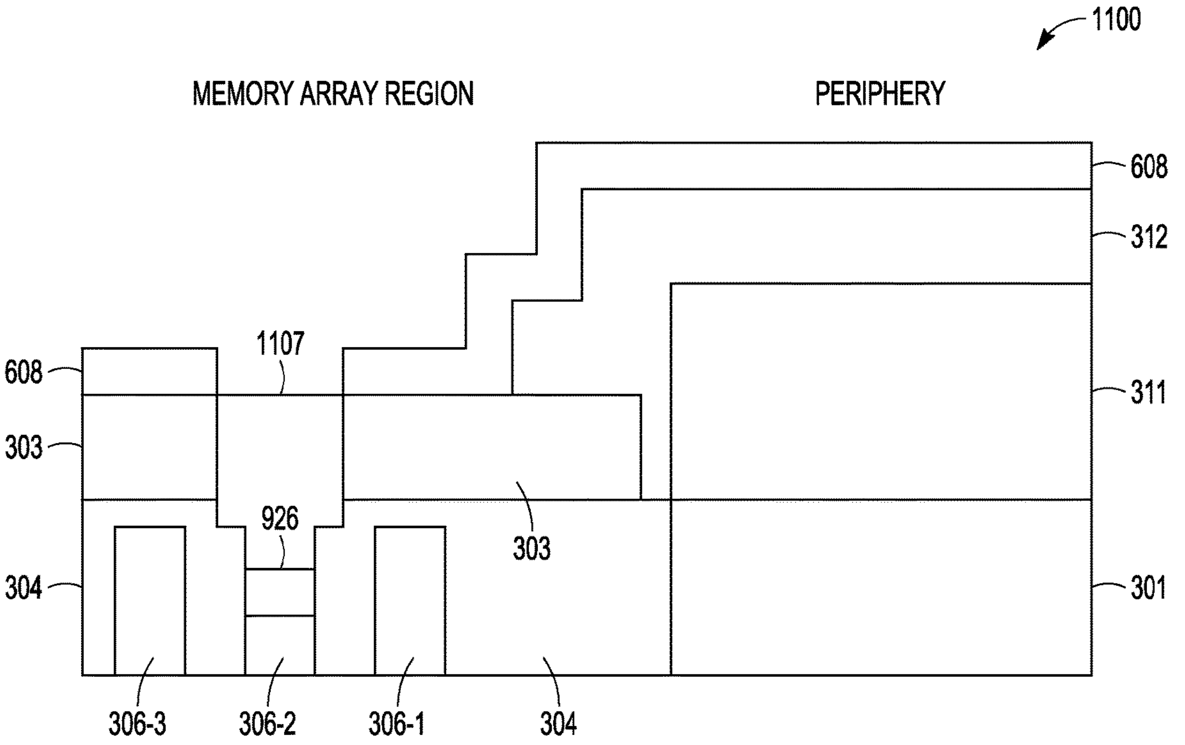

FIG. 11 illustrates a cross-sectional view of a structure 1100, having a memory array region and a periphery, after processing structure 1000 of FIG. 10. Metal barrier 1009 has been etched back leaving a digit line contact 1107 on and contacting polysilicon plug 926 on silicon region 306-2.

Figure 12:
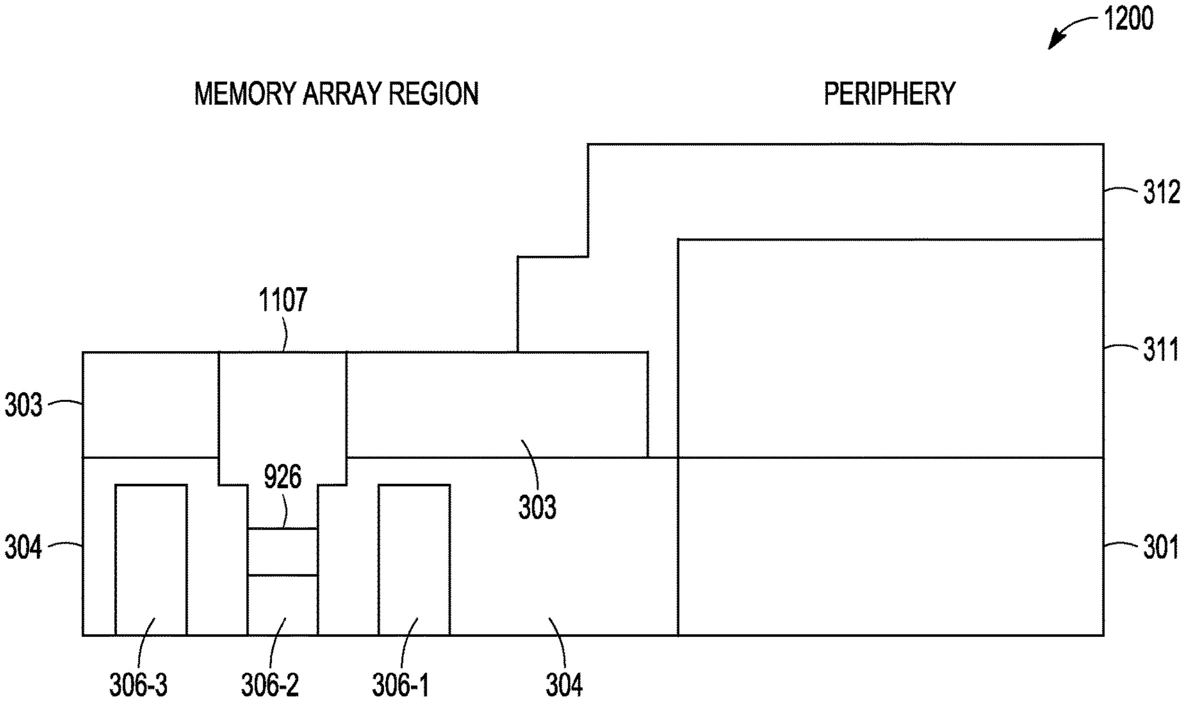

FIG. 12 illustrates a cross-sectional view of a structure 1200, having a memory array region and a periphery, after processing structure 1100 of FIG. 11. ILD 608 has been removed in the memory array region and in the periphery. A top surface of ILD 303 and a top surface of digit line contact 1107 are exposed in the memory array region and a top surface of sacrificial polysilicon 312 is exposed in the periphery.

Figure 13:
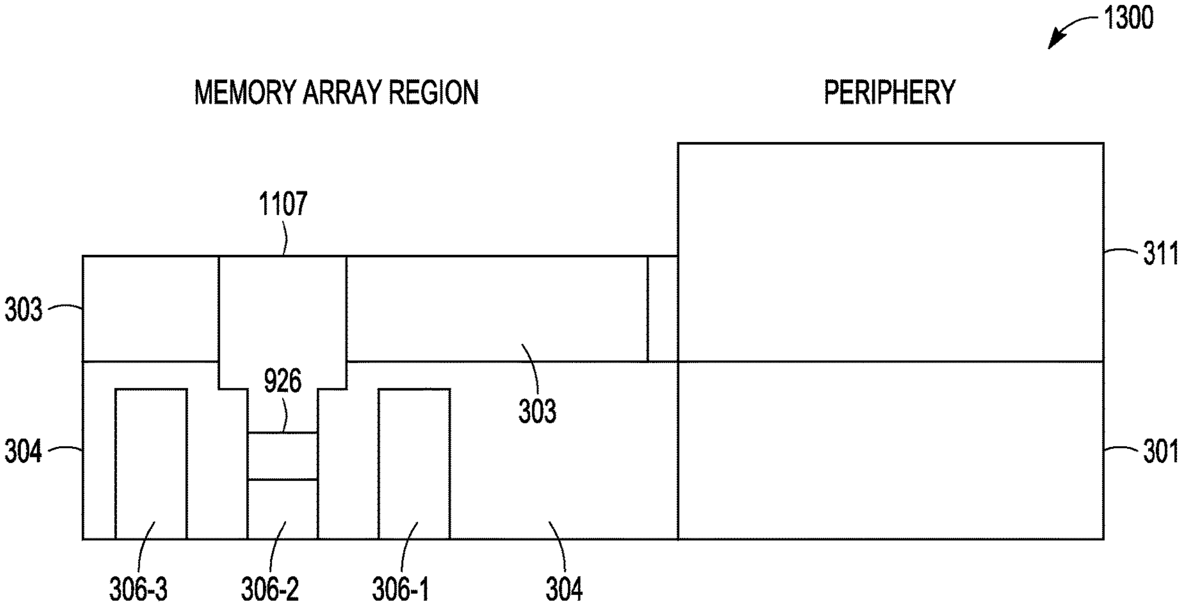

FIG. 13 illustrates a cross-sectional view of a structure 1300, having a memory array region and a periphery, after processing structure 1200 of FIG. 12. Sacrificial polysilicon 312 has has been removed in the periphery, exposing a top surface of gate 311 and a side surface above a level of ILD 303. The top surface of ILD 303 and the surface of digit line contact 1107 remain exposed in the memory array region.

Figure 14:
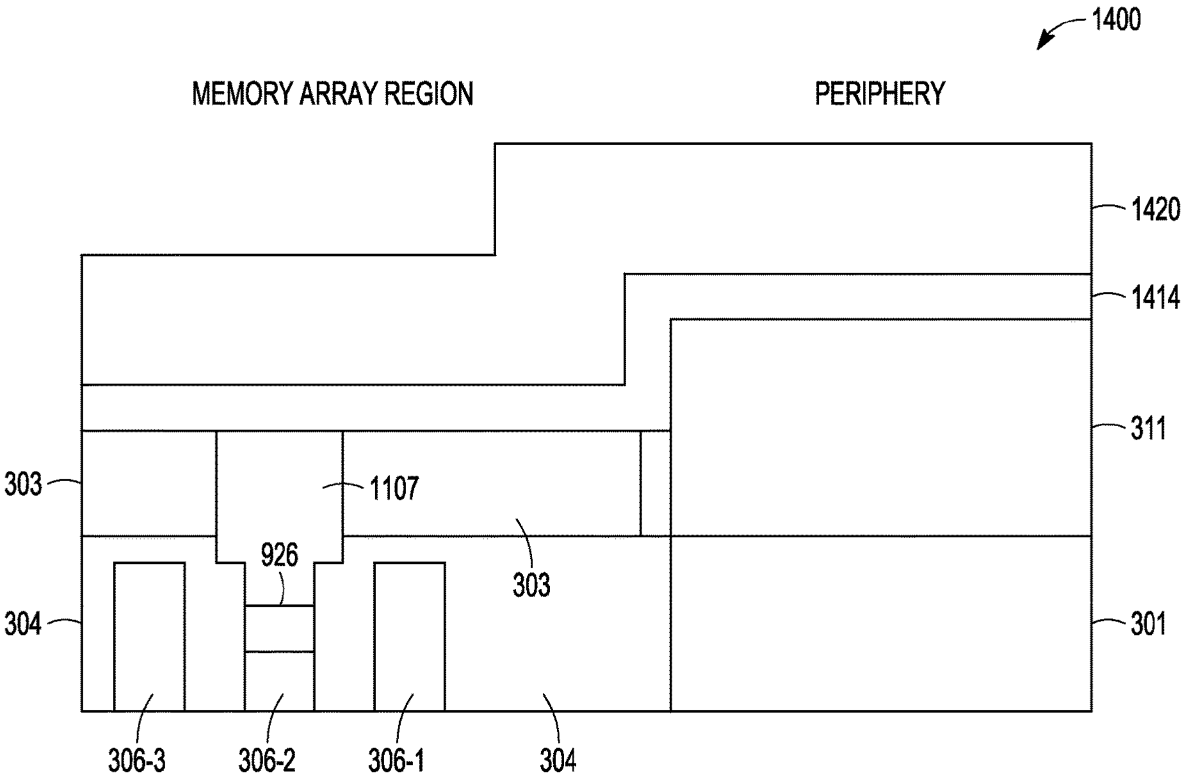

FIG. 14 illustrates a cross-sectional view of a structure 1400, having a memory array region and a periphery, after processing structure 1300 of FIG. 13. A barrier metal 1414 has been formed on the surface of structure 1300 of FIG. 13 in both the memory array region and in the periphery, including on the top surface of digit line contact 1107 that is on and contacting polysilicon plug 926 on silicon region 306-2. Barrier metal 1414 can be formed by a suitable process such as by a deposition process including but is not limited to PVD, CVD, ALD, or other deposition process. Other processes can be used. Barrier metal 1414 can be formed as $WSi_x$. Barrier metal 1414 can be formed having a thickness of about 2.5 nm to 3 nm. Barrier metal 1414 can be formed with other thicknesses.

A metal 1420 has been formed on the surface of barrier metal 1414 in both the memory array region and in the periphery. Metal 1420 can be formed by a suitable process such as by a deposition process including but not limited to PVD, CVD, ALD, or other deposition process. Other processes can be used. Metal 1420 can be formed as W. Metal 1420 can be formed having a thickness of about 14 nm. Metal 1420 can be formed with other thicknesses. In the periphery, metal 1420 is a metal contact to the transistor having metal gate 311, where barrier metal 1414 contacts metal gate 311 and contacts metal 1420. In the memory array region, metal 1420 is a digit line having barrier metal 1414 as a single metal barrier region above ILD 303, where barrier metal 1414 contacts the digit line and contacts the digit line contact 1107 that is on and contacting polysilicon plug 926 on silicon region 306-2.

Structure 1400 can be further processed such that metal 1420 in the periphery is separated from metal 1420 in the memory array region. Structure 1400 with the separated metal 1420 has a single metal barrier region to connect the separated metal 1420 to the digit line contact 1107 in the memory array region, which is a structure similar to architecture 100 of FIG. 1. Depending on the memory device design and conductive contact architecture for the memory device, metallic materials other than those discussed above can be used in similar approaches.

Figure 15:
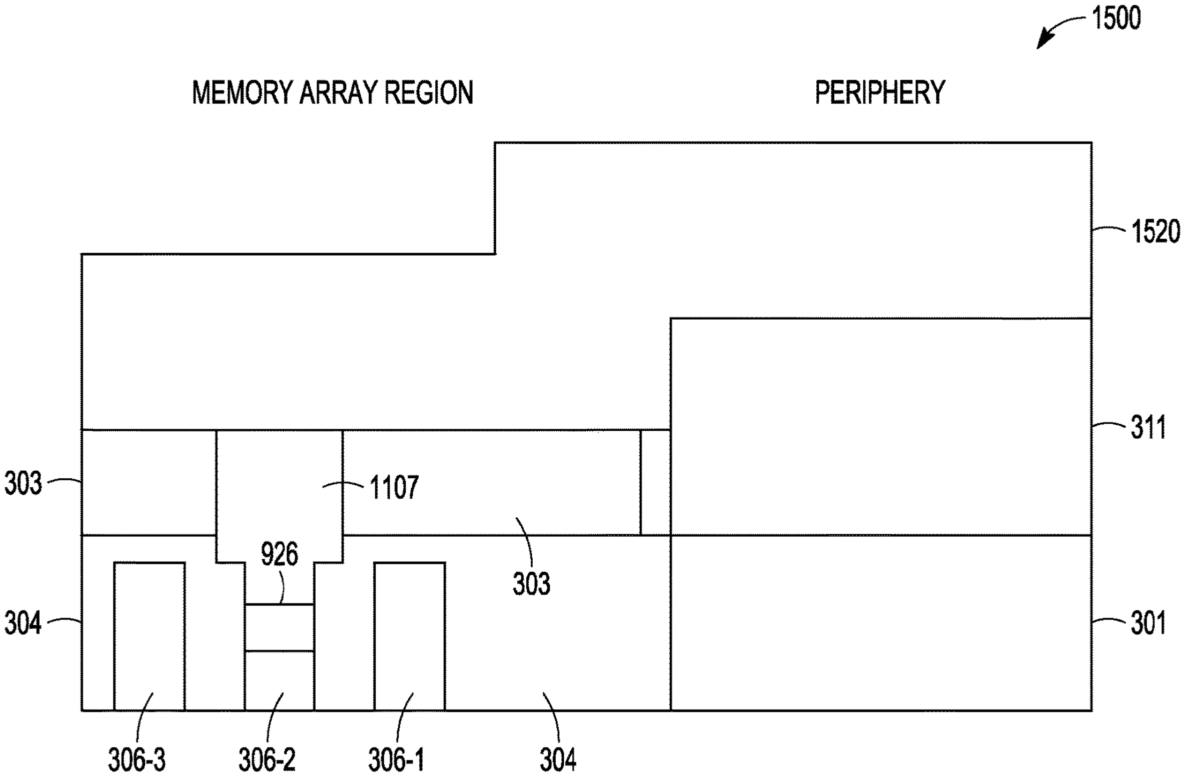
FIG. 15 illustrates an alternative process stage to the stage of FIG. 14 in the process flow of FIGS. 3-14, according to various embodiments.

FIG. 15 illustrates an alternative process stage to the stage of FIG. 14 in the process flow of FIGS. 3-14. FIG. 15 illustrates a cross-sectional view of a structure 1500, having a memory array region and a periphery, after processing structure 1300 of FIG. 13. A metal 1520 has been formed directly on the surface of gate 311 in the periphery and on the top surface of ILD 303 and the top surface of digit line contact 1107, which is on and contacting polysilicon plug 926 on silicon region 306-2, in the memory array region. Metal 1520 can be formed by a suitable process such as by a deposition process including but not limited to PVD, CVD, ALD, or other deposition process. Other processes can be used. Metal 1520 can be formed as W. Metal 1520 can be formed having a thickness of about 14 nm. Metal 1520 can be formed with other thicknesses. In the periphery, metal 1520 is a direct metal contact to metal gate 311. In the memory array region, metal 1520 is directly on and contacting ILD 303 and is directly on and contacting digit line contact 1107 that is on and contacting polysilicon plug 926 on silicon region 306-2.

Structure 1500 can be further processed such that metal 1520 in the periphery is separated from metal 1520 in the memory array region. Structure 1500 with the separated metal 1520 has a connection from the separated metal 1520 to digit line contact 1107 in the memory array region, which is a structure similar to architecture 200 of FIG. 2. Depending on the memory device design and conductive contact architecture for the memory device, metallic materials other than those discussed above can be used in similar approaches.

Figure 16:
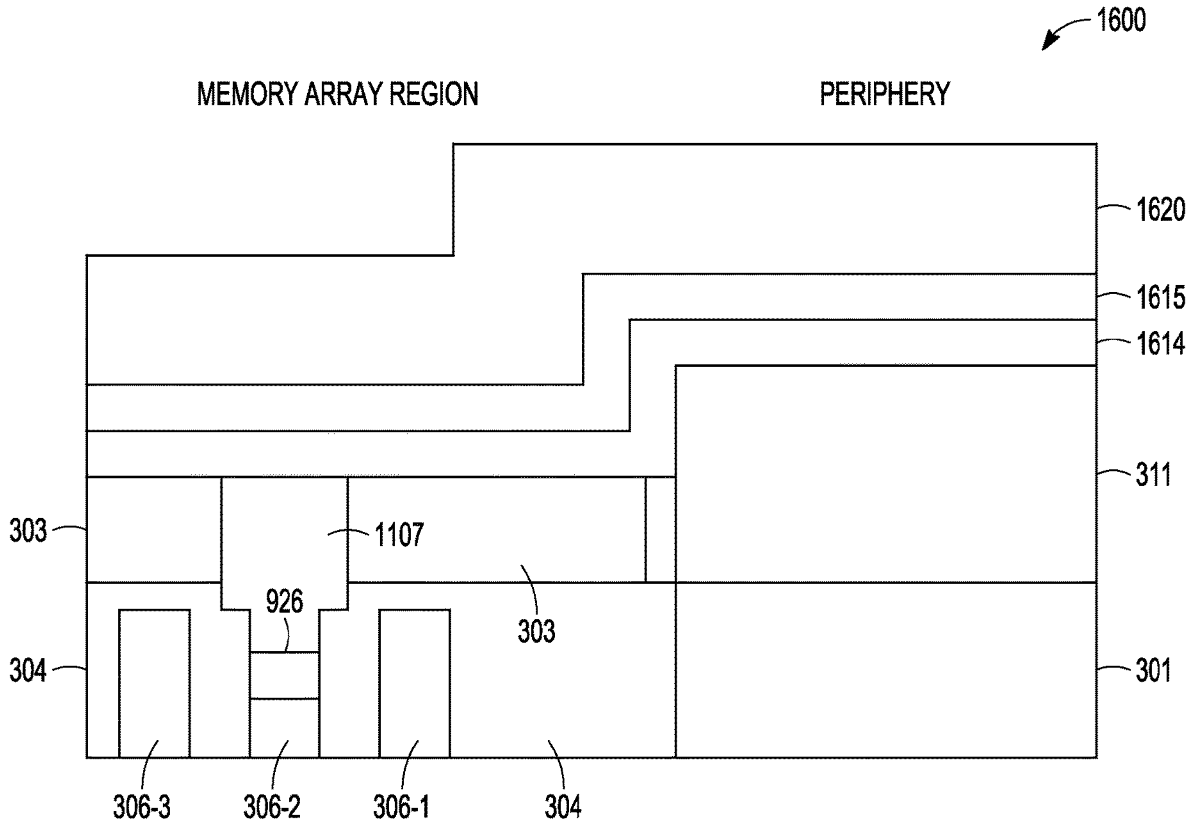
FIG. 16 illustrates another alternative process stage to the stage of FIG. 14 in the process flow of FIGS. 3-14, according to various embodiments.

FIG. 16 illustrates an alternative process stage to the stage of FIG. 14 in the process flow of FIGS. 3-14. FIG. 16 illustrates a cross-sectional view of a structure 1600, having a memory array region and a periphery, after processing structure 1300 of FIG. 13. A metal barrier 1614 has been formed on the surface of structure 1300 of FIG. 13 in both the memory array region and in the periphery, including on the top surface of digit line contact 1107 that is on and contacting polysilicon plug 926 on silicon region 306-2. Metal barrier 1614 can be formed by a suitable process such as by a deposition process including but is not limited to PVD, CVD, ALD, or other deposition process. Other processes can be used. Metal barrier 1614 can be formed using one or more of Ti or WN. Metal barrier 1614 can be formed having a thickness of about 4 nm to 10 nm. Metal barrier 1614 can be formed with other thicknesses and other metallic materials.

A metal barrier 1615 has been formed on the top surface of metal barrier 1614 in both the memory array region and in the periphery. Metal barrier 1615 can be formed by a suitable process such as by a deposition process including but not limited to PVD, CVD, ALD, or other deposition process. Other processes can be used. Metal barrier 1615 can be formed as $WSi_x$. Metal barrier 1615 can be formed having a thickness of about 2 nm to 5 nm. Metal barrier 1615 can be formed with other thicknesses and other metallic materials.

Metal 1620 is formed on metal barrier 1615 in both the memory array region and the periphery. Metal 1620 can be formed as W. Metal 1620 can be formed having a thickness of about 10 nm to about 30 nm. Metal 1620 can be formed with other thicknesses. Structure 1600 can be further processed such that metal 1620 in the periphery is separated from metal 1620 in the memory array region. Structure 1600 with the separated metal 1620 includes separated metal 1620 connected to digit line contact 1107 in the memory array region by multiple metal barrier regions. Structure 1600 with the separated metal 1620 includes separated metal 1620 connected to gate 311 by multiple metal barrier regions in the periphery. Depending on the memory device design and conductive contact architecture for the memory device, metallic materials other than those discussed above can be used in similar approaches.

Various deposition techniques for components of structures 300-1500 in the process flow of FIGS. 3-16 can be used that are typical for the material being formed, the dimensions of the material being formed, and the architecture in which the material is being formed. Selective etching can be used to remove selected regions in the processing discussed with respect to FIGS. 3-16. Selective etching is a process in which one or more materials are removed from a structure, while one or more other materials remain in the structure with no or little removal. Selective etching can depend on the material to be etched, the material not to be etched, the etchant employed, and the method for etching. Types of etching can include wet etching and dry etching, where each of these two basic methods can include a number of different etching procedures. In addition, conventional masking techniques, providing protective regions in the processing, can be used in removal of selected regions in connecting digit lines to digit line contacts in the memory array.

Figure 17:
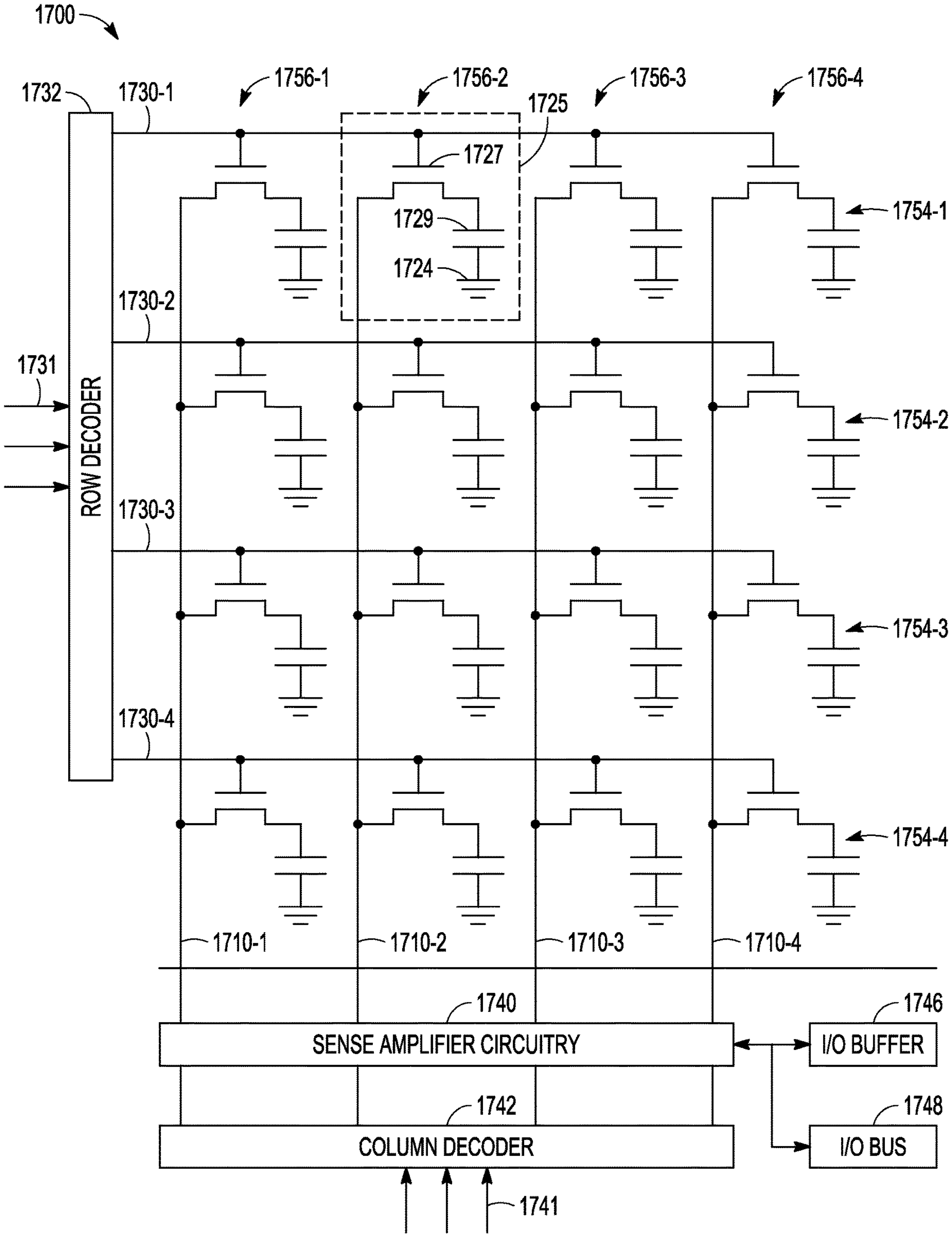
FIG. 17 is a schematic of an example dynamic random-access memory device that can include an architecture having a memory array region and a periphery to the memory array region after common processing of metal digit lines in the memory array region and metal contacts in the periphery, according to various embodiments.

FIG. 17 is a schematic of an embodiment of an example DRAM device 1700 that can include an architecture having a memory array region and a periphery to the memory array region after common processing of metal digit lines in the memory array region and metal contacts in the periphery, without polysilicon structured on a transistor gate to connect to a metal contact for the transistor in the periphery, as taught herein. DRAM device 1700 includes an array of memory cells 1725 (only one being labeled in FIG. 17 for ease of presentation) arranged in rows 1754-1, 1754-2, 1754-3, and 1754-4 and columns 1756-1, 1756-2, 1756-3, and 1756-4. For simplicity and ease of discussion, the array is shown in only two dimensions, but the array can be extended into the third dimension. Further, while only four rows 1754-1, 1754-2, 1754-3, and 1754-4 and four columns 1756-1, 1756-2, 1756-3, and 1756-4 of four memory cells are illustrated, DRAM devices like DRAM device 1700 can have significantly more memory cells 1725 (e.g., tens, hundreds, or thousands of memory cells) per row or per column.

Each memory cell 1725 can include a single transistor 1727 and a single capacitor 1729, which is commonly referred to as a 1T1C (one-transistor-one capacitor cell). One plate of capacitor 1729, which can be termed the "node plate," is connected to the drain terminal of transistor 1727, whereas the other plate of the capacitor 1729 is connected to ground 1724. Each capacitor 1729 within the array of 1T1C memory cells 1725 typically serves to store one bit of data, and the respective transistor 1727 serves as an access device to write to or read from storage capacitor 1729.

The transistor gate terminals within each row of rows 1754-1, 1754-2, 1754-3, and 1754-4 are portions of respective access lines 1730-1, 1730-2, 1730-3, and 1730-4 (for example, word lines), and the transistor source terminals within each of columns 1756-1, 1756-2, 1756-3, and 1756-4 are electrically connected to respective digit lines 1710-1, 1710-2, 1710-3, and 1710-4 (for example bit lines). A row decoder 1732 can selectively drive the individual access lines 1730-1, 1730-2, 1730-3, and 1730-4, responsive to row address signals 1731 input to row decoder 1732. Driving a given access line at a high voltage causes the access transistors within the respective row to conduct, thereby connecting the storage capacitors within the row to the respective digit lines, such that charge can be transferred between the digit lines and the storage capacitors for read or write operations. Both read and write operations can be performed via sense amplifier circuitry 1740, which can transfer bit values between the memory cells 1725 of the selected row of the rows 1754-1, 1754-2, 1754-3, and 1754-4 and input/output buffers 1746 (for write/read operations) or external input/output data buses 1748.

A column decoder 1742 responsive to column address signals 1741 can select which of the memory cells 1725 within the selected row is read out or written to. Alternatively, for read operations, the storage capacitors 1729 within the selected row may be read out simultaneously and latched, and the column decoder 1742 can then select which latch bits to connect to the output data bus 1748. Since read-out of the storage capacitors destroys the stored information, the read operation is accompanied by a simultaneous rewrite of the capacitor charge. Further, in between read/write operations, the capacitor charge is repeatedly refreshed to prevent data loss. Details of read/rewrite, write, and refresh operations are well-known to those of ordinary skill in the art.

Digit lines 1710-1, 1710-2, 1710-3, and 1710-4 can be constructed as metal digit lines in a process flow with a metal contact to a device or circuit in the periphery, as taught herein, that can include sense amplifier circuitry 1740. The metal can be the same for digit lines 1710-1, 1710-2, 1710-3, and 1710-4 and the metal contact and can be formed at the same time in the fabrication process flow. Digit lines 1710-1, 1710-2, 1710-3, and 1710-4 can be structured with at most one metal barrier to each respective digit line contact for digit lines 1710-1, 1710-2, 1710-3, and 1710-4, while the associated metal contacts in the periphery can be structured with at most one metal barrier to corresponding gates of the transistors in the periphery, where the metal contacts are connected to the gates without polysilicon located in the stack between the metal contacts and the gates. In other embodiments, digit lines 1710-1, 1710-2, 1710-3, and 1710-4 can be structured with multiple metal barriers to each respective digit line contact for digit lines 1710-1, 1710-2, 1710-3, and 1710-4, while the associated metal contacts in the periphery can be structured with multiple metal barriers to corresponding gates of the transistors in the periphery, where the metal contacts are connected to the gates without polysilicon located in the stack between the metal contacts and the gates. In various embodiments, digit lines 1710-1, 1710-2, 1710-3, and 1710-4 contact digit line contacts and the metal contacts in the periphery contact gates of transistors. Variations can include the number of metal barriers in the periphery being larger than the number of metal barriers to gates in the memory array region. Alternatively, the number of metal barriers in the memory array can be larger than the number of metal barriers to gates in the periphery. Reduction of unwanted capacitance in the memory array region can include limiting the thickness of metal barriers as a unit between digit lines and digit line contacts in the memory array region.

DRAM device 1700 may be implemented as an integrated circuit within a package that includes pins for receiving supply voltages (e.g., to provide the source and gate voltages for the transistors 1727) and signals (including data, address, and control signals). FIG. 17 depicts DRAM device 1700 in simplified form to illustrate basic structural components, omitting many details of the memory cells 1725 and associated access lines 1730-1, 1730-2, 1730-3, and 1730-4 and digit lines 1710-1, 1710-2, 1710-3, and 1710-4 as well as the peripheral circuitry. For example, in addition to the row decoder 1732 and column decoder 1742, sense amplifier circuitry 1740, and buffers 1746, DRAM device 1700 may include further peripheral circuitry, such as a memory control unit that controls the memory operations based on control signals (provided, e.g., by an external processor), additional input/output circuitry, etc. Details of such peripheral circuitry are generally known to those of ordinary skill in the art and not further discussed herein.

In two-dimensional (2D) DRAM arrays, the rows 1754-1, 1754-2, 1754-3, and 1754-4 and columns 1756-1, 1756-2, 1756-3, and 1756-4 of memory cells 1725 are arranged along a single horizontal plane (i.e., a plane parallel to the layers) of the semiconductor substrate, e.g., in a rectangular lattice with mutually perpendicular horizontal access lines 1730-1, 1730-2, 1730-3, and 1730-4 and digit lines 1710-1, 1710-2, 1710-3, and 1710-4. In 3D DRAM arrays, the memory cells 1725 are arranged in a 3D lattice that encompasses multiple vertically stacked horizontal planes corresponding to multiple device tiers of a multi-tier substrate assembly, with each device tier including multiple parallel rows of memory cells 1725 whose transistor gate terminals are connected by horizontal access lines such as access lines 1730-1, 1730-2, 1730-3, and 1730-4. A "device tier," as used herein, may include multiple layers (or levels) of materials, but forms the components of memory devices of a single horizontal tier of memory cells. Digit lines 1710-1, 1710-2, 1710-3, and 1710-4 can extend vertically through all or at least a vertical portion of the multi-tier structure, and each of the digit lines 1710-1, 1710-2, 1710-3, and 1710-4 can connect to the transistor source terminals of respective vertical columns 1756-1, 1756-2, 1756-3, and 1756-4 of associated memory cells 1725 at the multiple device tiers. Such a 3D configuration of memory cells enables further increases in bit density compared with 2D arrays.

Figure 18:
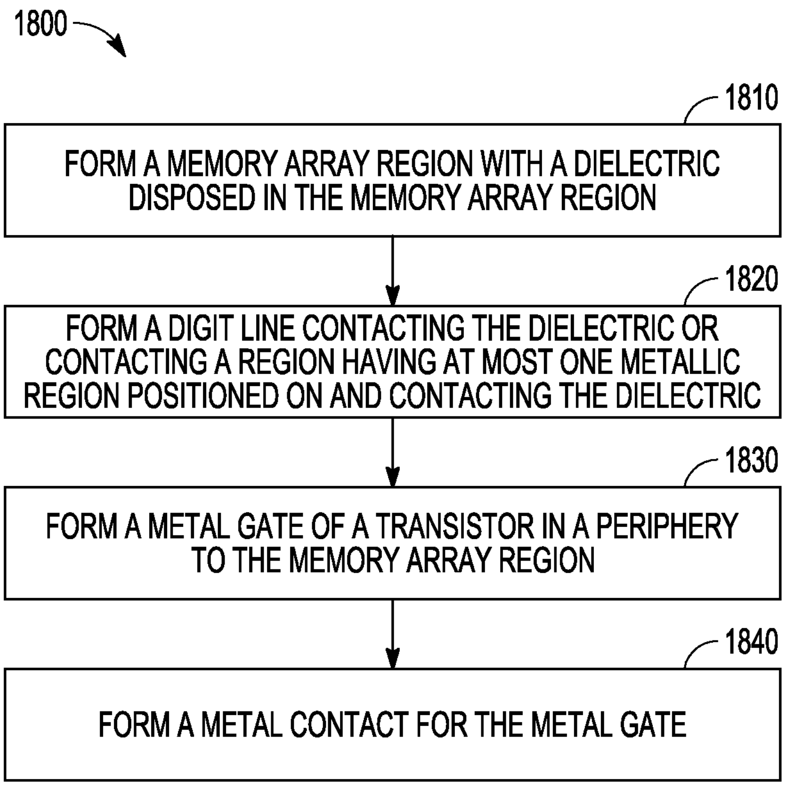
FIG. 18 is a flow diagram of features of an example method of an integrating process flow of a memory array region and a periphery to the memory array region, according to various embodiments.

FIG. 18 is a flow diagram of features of different stages of an embodiment of an example method 1800 of forming a memory device. At 1810, a memory array region is formed with a dielectric disposed in the memory array region. At 1820, a digit line is formed contacting the dielectric or contacting a region having at most one metallic region positioned on and contacting the dielectric. The digit line has a metal composition. The metal composition can include W or other metal having a low resistivity and appropriate thermal stability. The metal composition can be selected in conjunction with selection of other materials for integrated processing of the memory array region and a periphery to the memory array region. The dielectric can include dielectric material to electrically isolate the digit line from paths to memory cell structures with the digit line connected to paths of selected memory cell structures at selected locations across the dielectric. The dielectric can include silicon oxide, silicon nitride, combinations of silicon oxide and silicon nitride, or other dielectric material appropriate for fabricating the memory device and appropriate for the structure of the memory device.

At 1830, a metal gate of a transistor is formed in a periphery to the memory array region. At 1840, a metal contact is formed for the metal gate. Forming the metal contact can be implemented contacting the metal gate or contacting a region having at most one metal barrier region, where the at most one metal barrier region is above and contacting the metal gate. The metal contact can have the metal composition of the digit line. Method 1800 illustrates different stages that can be executed in various orders. The different stages can be performed in line with other stages of forming the memory device or similar memory devices. For example, other common components for such a memory device can be structured in a conventional processing format.

Variations of method 1800 or methods similar to method 1800 can include a number of different embodiments that may be combined depending on the application of such methods and/or the architecture of systems for which such methods are implemented. Such methods can include forming digit line contacts arranged in a pattern for a memory array of the memory array region, where the digit line contacts are provided for the digit line. Variations can include forming sacrificial polysilicon on the metal gate, providing a protective layer to the metal gate during processing of digit line contacts in a pattern in the dielectric in the memory array region, and removing the sacrificial polysilicon from the metal gate prior to forming the digit line and the metal contact.

Variations of method 1800 or methods similar to method 1800 can include forming the digit line and the metal contact using W. The at most one metallic region can be formed by forming $WSi_x$ extending above and from a top level of the dielectric. The at most one metal barrier region can be formed by forming $WSi_x$ extending above and from a top level of the metal gate.

Variations of method 1800 or methods similar to method 1800 can include forming the digit line by forming a tungsten digit line directly on and extending above a top level of the dielectric. The metal contact can be formed by forming a tungsten metal contact directly on and extending above a top level of the metal gate.

Figure 19:
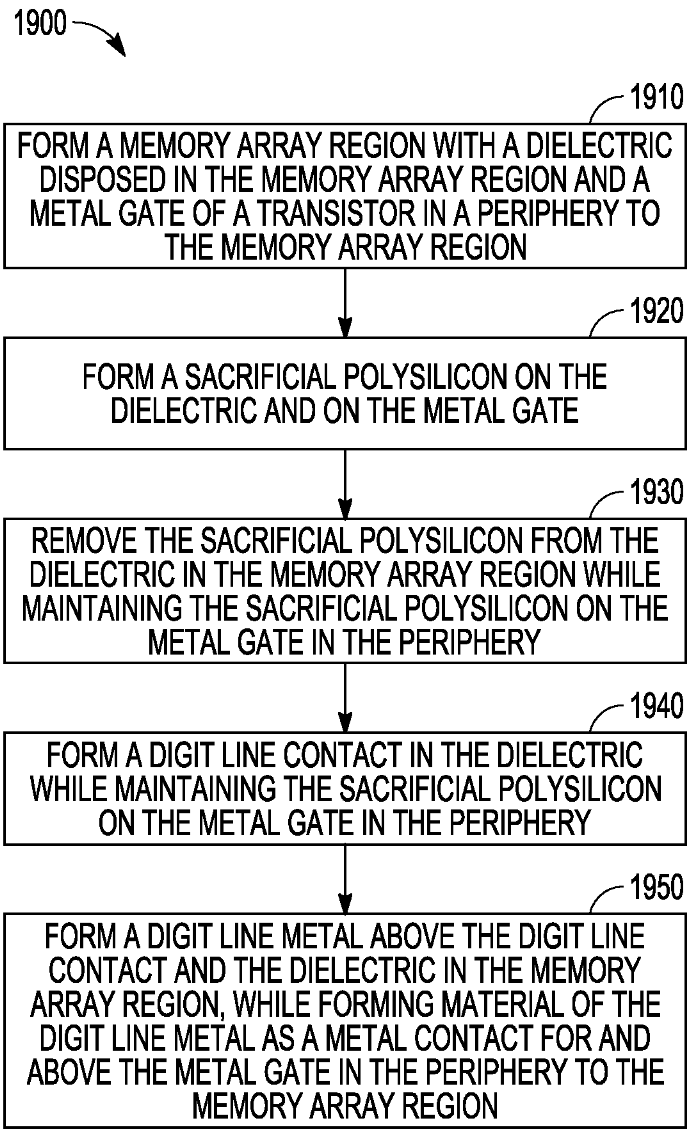
FIG. 19 is a flow diagram of features of another example method of an integrating process flow of a memory array region and a periphery to the memory array region, according to various embodiments.

FIG. 19 is a flow diagram of features of an embodiment of an example method 1900 of forming a memory device. At 1910, a memory array region is formed with a dielectric disposed in the memory array region and a metal gate of a transistor is formed in a periphery to the memory array region. At 1920, a sacrificial polysilicon is formed on the dielectric and on the metal gate. At 1930, the sacrificial polysilicon is removed from the dielectric in the memory array region while maintaining the sacrificial poly silicon on the metal gate in the periphery. At 1940, a digit line contact is formed in the dielectric while maintaining the sacrificial polysilicon on the metal gate in the periphery. At 1950, a digit line metal is formed above the digit line contact and the dielectric in the memory array region, while forming material of the digit line metal as a metal contact for and above the metal gate in the periphery to the memory array region.

Variations of method 1900 or methods similar to method 1900 can include a number of different embodiments that may be combined depending on the application of such methods and/or the architecture of systems for which such methods are implemented. Such methods can include removing the sacrificial polysilicon from the metal gate in the periphery, after forming the digit line contact in the dielectric and before forming the digit line metal and the material of the digit line metal as the metal contact. Variations can include forming, after removing the sacrificial polysilicon from the metal gate in the periphery, a metallic region on and contacting the dielectric; forming, after removing the sacrificial polysilicon from the metal gate in the periphery, a metal barrier region on and contacting the metal gate; forming the digit line metal on and contacting the metallic region; and forming the material of the digit line metal as the metal contact on and contacting the metal gate. The metallic region can include W or other metal having a low resistivity and appropriate thermal stability. Other variations can include forming, after removing the sacrificial polysilicon from the metal gate in the periphery, the digit line metal directly on and contacting the digit line contact and directly on and contacting a top surface of the dielectric; and forming, after removing the sacrificial polysilicon from the metal gate in the periphery, the material of the digit line metal as the metal contact on and contacting the metal gate.

Variations of method 1900 or methods similar to method 1900 can include forming the digit line contact to include forming an opening in the dielectric in the memory array region, exposing a silicon region in the memory array region. Polysilicon can be formed in the opening to the silicon region and above an interlayer dielectric formed on the sacrificial polysilicon that was formed on the metal gate in the periphery. The polysilicon can be removed from the memory array region and from above the interlayer dielectric in the periphery such that a portion of the poly silicon remains on the silicon region. The digit line contact can be formed on and contacting the portion of the polysilicon that remains on the silicon region. The silicon region can provide a conductive path to the memory array of the memory device.

The fabrication techniques used in methods 1800, 1900, or methods similar to methods 1800 and 1900 can use conventional techniques for removing material such as masking, etching, and other removal processes. The formation techniques can use conventional techniques for forming materials in semiconductor based memory devices. Formation techniques can include one or more deposition processes such as, but not limited to, PVD, CVD, or ALD.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., Internet-of-Things (IoT) devices, etc.), have varying storage needs depending on, among other things, the type of electronic device, use environment, performance expectations, etc. Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc. As used herein, “processor device” means any type of computational circuit such as, but not limited to, a microprocessor, a microcontroller, a graphics processor, a digital signal processor (DSP), or any other type of processor or processing circuit, including a group of processors or multi-core devices.

In various embodiments, a memory device can comprise a memory array region and a dielectric disposed in the memory array region. A digit line, having a metal composition, can contact the dielectric or contact a region having at most one metallic region positioned on and contacting the dielectric. A transistor is located in a periphery to the memory array region and a metal contact is provided for the transistor. The metal contact contacts the metal gate of the transistor or contacts a region having at most one metal barrier region. The at most one metal barrier region can be positioned above and contacting the metal gate. The metal contact has the metal composition of the digit line. Alternatively, the metal contact contacts a region having multiple metal barrier regions. Digit line contacts for the digit line in the dielectric can be arranged in a pattern for a memory array of the memory array region.

Variations of such a memory device and its features, as taught herein, can include a number of different embodiments and features that may be combined depending on the application of such memory devices, the format of such memory devices, and/or the architecture in which such memory devices are implemented. Features of such memory devices can include the metal composition including W. The metal composition can be completely structured with W.

Variations of such a memory device and its features can include the at most one metallic region to include $WSi_x$ extending above and from a top level of the dielectric, and the at most one metal barrier region includes $WSi_x$. The $WSi_x$ can extend above the top level of the dielectric by about 3 nm and the $WSi_x$ can extend above a top level of the metal gate by about 3 nm. The tungsten silicides can be structured with other dimensions.

Variations of such a memory device and its features can include the digit line being a tungsten digit line directly on and extending above the dielectric. The metal contact can be structured directly on the metal gate. The tungsten digit line and the metal contact can have a thickness of about 14 nm. Variations of such a memory device and its features can include a step height between a top level of the metal contact on the transistor in the periphery to a top level of the digit line in the memory array region can be about 9 nm. The memory array region and the periphery can be structured having a different step height.

Variations of such a memory device and its features can include the transistor being a transistor of a complementary metal oxide semiconductor (CMOS) device. The metal gate of the transistor can be a high-k metal gate.

Figure 20:
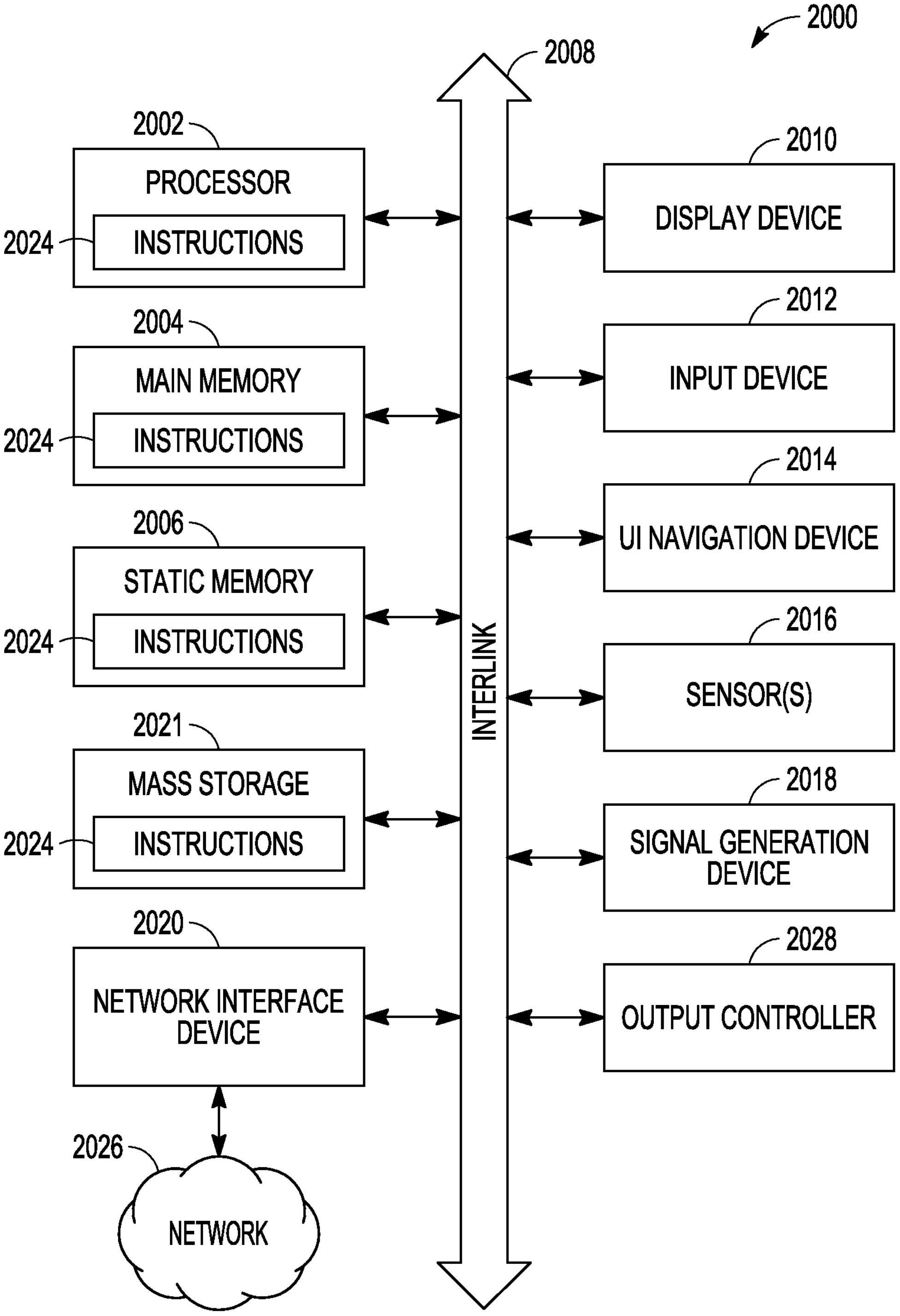
FIG. 20 is a block diagram illustrating an example of a machine upon which one or more embodiments of one or more memory components may be implemented, according to various embodiments.

FIG. 20 illustrates a block diagram of an example machine 2000 having one or more embodiments of memory components discussed herein. In alternative embodiments, machine 2000 may operate as a standalone device or may be connected (e.g., networked) to other machines. In a networked deployment, machine 2000 may operate in the capacity of a server machine, a client machine, or both in server-client network environments. In an example, machine 2000 may act as a peer machine in peer-to-peer (P2P) (or other distributed) network environment. Machine 2000 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term “machine” shall also be taken to include any collection of machines that individually or jointly execute a set (or multiple sets) of instructions to perform one or more of methodologies such as, but not limited to, cloud computing, software as a service (SaaS), or other computer cluster configurations. Example machine 2000 can include one or more memory devices having structures as discussed with respect to architecture 100 of FIG. 1, architecture 200 of FIG. 2, structure 1400 of FIG. 14, structure 1500 of FIG. 15, or structure 1600 of FIG. 16.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. The instructions enable participating hardware (e.g., the execution units or a loading mechanism) to create members of the circuitry in hardware via the variable connections to carry out portions of the specific tasks when in operation. Accordingly, the computer-readable medium is in communication with the other components of the circuitry when the device is operating. In an example, any of the physical components may be used in more than one member of more than one circuitry.

Machine (e.g., computer system) 2000 may include a hardware processor 2002 (e.g., a CPU, a GPU, a hardware processor core, or any combination thereof), a main memory 2004 and a static memory 2006, some or all of which may communicate with each other via an interlink (e.g., bus) 2008. Machine 2000 may further include a display unit 2010, an alphanumeric input device 2012 (e.g., a keyboard), and a user interface (UI) navigation device 2014 (e.g., a mouse). In an example, display unit 2010, alphanumeric input device 2012, and UI navigation device 2014 may be a touch screen display. Machine 2000 may additionally include a mass storage (e.g., drive unit) 2021, a signal generation device 2018 (e.g., a speaker), a network interface device 2020, and one or more sensors 2016, such as a global positioning system (GPS) sensor, compass, accelerometer, or other sensor. Machine 2000 may include an output controller 2028, such as a serial (e.g., USB, parallel, or other wired or wireless (e.g., infrared (IR), near field communication (NFC), etc.) connection to communicate or control one or more peripheral devices (e.g., a printer, card reader, etc.).

Machine 2000 may include a machine-readable medium on which is stored one or more sets of data structures or instructions 2024 (for example, software or microcode) embodying or utilized by machine 2000. Instructions 2024 may also reside, completely or at least partially, within main memory 2004, within static memory 2006, within mass storage 2021, or within hardware processor 2002 during execution thereof by machine 2000. In an example, one or any combination of hardware processor 2002, main memory 2004, static memory 2006, or mass storage 2021 may constitute machine-readable medium. Machine-readable medium can be a single medium or multiple media (e.g., a centralized or distributed database, or associated caches and servers) configured to store one or more instructions 2024.

The term "machine-readable medium" may include any medium that is capable of storing instructions for execution by machine 2000 and that cause machine 2000 to perform any one or more of the techniques for which machine 2000 is implemented. Non-limiting machine-readable medium examples may include solid-state memories, and optical and magnetic media. Non-volatile machine-readable medium may include semiconductor memory devices such as EPROM, EEPROM, and flash memory devices; magnetic disks, such as internal hard disks and removable disks; magneto-optical disks; and compact disc-ROM (CD-ROM) and digital versatile disc-read only memory (DVD-ROM) disks. Volatile machine-readable medium may include (RAM), DRAM, SRAM, or SDRAM.

Instructions 2024 (e.g., software, programs, microcode, an operating system (OS), etc.) or other data stored on mass storage 2021, can be accessed by memory 2004 for use by processor 2002. Memory 2004 (e.g., DRAM) is typically fast, but volatile, and thus a different type of storage than mass storage 2021 (e.g., an SSD), which is suitable for long-term storage, including while in an "off" condition. Instructions 2024 or data in use by a user or machine 2000 are typically loaded in memory 2004 for use by processor 2002. When memory 2004 is full, virtual space from mass storage 2021 can be allocated to supplement memory 2004; however, because mass storage 2021 is typically slower than memory 2004, and write speeds are typically at least twice as slow as read speeds, use of virtual memory can greatly reduce user experience due to storage device latency (in contrast to memory 2004, e.g., DRAM). Further, use of mass storage 2021 for virtual memory can greatly reduce the usable lifespan of mass storage 2021.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival SATA based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

Instructions 2024 may further be transmitted or received over a communications network 2026 using a transmission medium via network interface device 2020 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, network interface device 2020 may include one or more physical jacks (e.g., Ethernet, coaxial, or phone jacks) or one or more antennas to connect to the communications network 2026. In an example, network interface device 2020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of transporting instructions for execution by machine 2000 or data to or from machine 2000. The transportation can include using digital or analog communications signals that can be transmitted over the transmission medium to facilitate communication of such software or data.

The following are example embodiments of devices and methods, in accordance with the teachings herein.

An example memory device 1 can comprise: a memory array region; a dielectric disposed in the memory array region; a digit line contacting the dielectric or contacting a region having at most one metallic region positioned on and contacting the dielectric, the digit line having a metal composition; a transistor in a periphery to the memory array region; and a metal contact contacting a metal gate of the transistor or contacting a region having at most one metal barrier region, the at most one metal barrier region above and contacting the metal gate, the metal contact having the metal composition.

An example memory device 2 can include features of example memory device 1 and can include the memory device having digit line contacts in the dielectric for the digit line, the digit line contacts arranged in a pattern for a memory array of the memory array region.

An example memory device 3 can include features of any of the preceding example memory devices and can include the metal composition including W.

An example memory device 4 can include features of any of the preceding example memory devices and can include the at most one metallic region including $WSi_x$ extending above and from a top level of the dielectric, and the at most one metal barrier region including $WSi_x$.

An example memory device 5 can include features of example memory device 4 and any features of the preceding example memory devices and can include the $WSi_x$ extending above the top level of the dielectric by about 3 nm and the $WSi_x$ extending above a top level of the metal gate by about 3 nm.

An example memory device 6 can include features of any of the preceding example memory devices and can include the digit line being a tungsten digit line directly on and extending above the dielectric and the metal contact being directly on the metal gate.

An example memory device 7 can include features of example memory device 6 and any features of the preceding example memory devices and can include the tungsten digit line and the metal contact having a thickness of about 14 nm.

An example memory device 8 can include features of any of the preceding example memory devices and can include a step height between a top level of the metal contact on the transistor in the periphery to a top level of the digit line in the memory array region being about 9 nm.

An example memory device 9 can include features of example memory device 8 and any features of the preceding example memory devices and can include the transistor being a transistor of a complementary metal oxide semiconductor (CMOS) device.

An example memory device 10 can include features of any of the preceding example memory devices and can include the metal gate of the transistor being a high-k metal gate.

In an example memory device 11, any of the memory devices of example memory devices 1 to 10 may include memory devices incorporated into an electronic memory apparatus further comprising a host processor and a communication bus extending between the host processor and the memory device.

In an example memory device 12, any of the memory devices of example memory devices 1 to 11 may be modified to include any structure presented in another of example memory device 1 to 11.

In an example memory device 13, any of the memory devices of example memory devices 1 to 12 may be modified to include any structure presented in another of example memory device 1 to 12.

In an example memory device 14, any apparatus associated with the memory devices of example memory devices 1 to 13 may further include a machine-readable storage device configured to store instructions as a physical state, wherein the instructions may be used to perform one or more operations of the apparatus.

In an example memory device 15, any of the memory devices of example memory devices 1 to 14 may be formed in accordance with any of the methods of the below example methods 1 to 17.

An example method 1 of forming a memory device can comprise: forming a memory array region with a dielectric disposed in the memory array region; forming a digit line contacting the dielectric or contacting a region having at most one metallic region positioned on and contacting the dielectric, the digit line having a metal composition; forming a metal gate of a transistor in a periphery to the memory array region; and forming a metal contact contacting the metal gate or contacting a region having at most one metal barrier region, the at most one metal barrier region above and contacting the metal gate, the metal contact having the metal composition.

An example method 2 of forming a memory device can include features of example method 1 of forming a memory device and can include forming digit line contacts arranged in a pattern for a memory array of the memory array region, the digit line contacts provided for the digit line.

An example method 3 of forming a memory device can include features of any of the preceding example methods of forming a memory device and can include forming sacrificial polysilicon on the metal gate, providing a protective layer to the metal gate during processing of digit line contacts in a pattern in the dielectric in the memory array region; and removing the sacrificial polysilicon from the metal gate prior to forming the digit line and the metal contact.

An example method 4 of forming a memory device can include features of any of the preceding example methods of forming a memory device can include forming the digit line and the metal contact using W; forming the at most one metallic region by forming $WSi_x$ extending above and from a top level of the dielectric; and forming the at most one metal barrier region by forming $WSi_x$ extending above and from a top level of the metal gate.

An example method 5 of forming a memory device can include features of any of the preceding example methods of forming a memory device and can include forming the digit line by forming a tungsten digit line directly on and extending above a top level of the dielectric; and forming the metal contact by forming a tungsten metal contact directly on and extending above a top level of the metal gate.

In an example method 6, any of the example methods 1 to 5 of forming a memory device may be performed in forming an electronic memory apparatus further comprising a host processor and a communication bus extending between the host processor and the memory device.

In an example method 7, any of the example methods 1 to 6 of forming a memory device may be modified to include operations set forth in any other of method examples 1 to 6 of forming a memory device.

In an example method 8 of forming a memory device, any of the example methods 1 to 7 of forming a memory device may be implemented at least in part through use of instructions stored as a physical state in one or more machine-readable storage devices.

An example method 9 of forming a memory device can include features of any of the preceding example methods 1 to 8 of forming a memory device and can include performing functions associated with any features of example memory devices 1 to 16.

An example method 10 of forming a memory device can comprise: forming a memory array region with a dielectric disposed in the memory array region and a metal gate of a transistor in a periphery to the memory array region; forming a sacrificial polysilicon on the dielectric and on the metal gate; removing the sacrificial polysilicon from the dielectric in the memory array region while maintaining the sacrificial polysilicon on the metal gate in the periphery; forming a digit line contact in the dielectric while maintaining the sacrificial polysilicon on the metal gate in the periphery; and forming a digit line metal above the digit line contact and the dielectric in the memory array region, while forming material of the digit line metal as a metal contact for and above the metal gate in the periphery to the memory array region.

An example method 11 of forming a memory device can include features of example method 10 of forming a memory device and can include removing the sacrificial polysilicon from the metal gate in the periphery, after forming the digit line contact in the dielectric and before forming the digit line metal and the material of the digit line metal as the metal contact.

An example method 12 of forming a memory device can include features of example method 11 of forming a memory device of any of the preceding example method 10 of forming a memory device and can include forming, after removing the sacrificial polysilicon from the metal gate in the periphery, a metallic region on and contacting the dielectric; forming, after removing the sacrificial polysilicon from the metal gate in the periphery, a metal barrier region on and contacting the metal gate; forming the digit line metal on and contacting the metallic region; and forming the material of the digit line metal as the metal contact on and contacting the metal gate.

An example method 13 of forming a memory device can include features of example method 11 of forming a memory device of any of the preceding example method 10 of forming a memory device and can include forming, after removing the sacrificial polysilicon from the metal gate in the periphery, the digit line metal directly on and contacting the digit line contact and directly on and contacting a top surface of the dielectric; and forming, after removing the sacrificial polysilicon from the metal gate in the periphery, the material of the digit line metal as the metal contact on and contacting the metal gate.

An example method 14 of forming a memory device can include features of any of the preceding example methods 10 to 13 of forming a memory device and can include forming the digit line contact to include: forming an opening in the dielectric in the memory array region, exposing a silicon region in the memory array region; forming poly silicon in the opening to the silicon region and above an interlayer dielectric formed on the sacrificial poly silicon formed on the metal gate in the periphery; removing the poly silicon from the memory array region and from above the interlayer dielectric in the periphery such that a portion of the polysilicon remains on the silicon region; and forming the digit line contact on and contacting the portion of the polysilicon that remains on the silicon region.

In an example method 15 of forming a memory device, any of the example methods 10 to 14 of forming a memory device may be performed in forming an electronic memory apparatus further comprising a host processor and a communication bus extending between the host processor and the memory device.

In an example method 16 of forming a memory device, any of the example methods 10 to 15 of forming a memory device may be modified to include operations set forth in any other of method examples 10 to 15 of forming a memory device.

In an example method 17 of forming a memory device, any of the example methods 10 to 16 of forming a memory device may be modified to include operations set forth in any other of method examples 1 to 16 of forming a memory device.

In an example method 18 of forming a memory device, any of the example methods 10 to 17 of forming a memory device may be implemented at least in part through use of instructions stored as a physical state in one or more machine-readable storage devices.

An example method 19 of forming a memory device can include features of any of the preceding example methods 10 to 18 of forming a memory device and can include performing functions associated with any features of example memory devices 1 to 15.

An example machine-readable storage device 1 storing instructions, that when executed by one or more processors, cause a machine to perform operations, can comprise instructions to perform functions associated with any features of example memory devices 1 to 15 or perform methods associated with any features of example methods 1 to 19.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A memory device comprising:

a memory array region;

a dielectric disposed in the memory array region;

a digit line contacting the dielectric in the memory array region or contacting a region having at most one metallic region positioned on and contacting the dielectric in the memory array region, the digit line having a metal composition;

a transistor in a periphery to the memory array region, the transistor having a high-k metal gate; and a metal contact contacting the high-k metal gate of the transistor or contacting a region having at most one metal barrier region, the at most one metal barrier region above and contacting, the high-k metal gate, the metal contact having the metal composition of the digit line, with a region between and including the metal contact to a high-k dielectric of the high-k metal gate composed of only conductive metallic materials.

2. The memory device of claim 1, wherein the memory device has digit line contacts in the dielectric for the digit line, the digit line contacts arranged in a pattern for a memory array of the memory array region.

3. The memory device of claim 1, wherein the metal composition includes tungsten.

4. The memory device of claim 1, wherein the at most one metallic region on the dielectric includes tungsten silicide extending above and from a top level of the dielectric, and the at most one metal barrier region above and contacting the high-k metal gate includes tungsten silicide.

5. The memory device of claim 4, wherein the tungsten silicide on the dielectric extends above the top level of the dielectric by about 3 nm and the tungsten silicide above and contacting the high-k metal gate extends above a top level of the high-k metal gate by about 3 nm.

6. The memory device of claim 1, wherein the digit line is a tungsten digit line directly on and extending above the dielectric and the metal contact is directly on the high-k metal gate.

7. The memory device of claim 6, wherein the tungsten digit line and the metal contact have a thickness of about 14 nm.

8. The memory device of claim 1, wherein a step height between a top level of the metal contact on the transistor in the periphery to a top level of the digit line in the memory array region is about 9 nm.

9. The memory device of claim 1, wherein the transistor is a transistor of a complementary metal oxide semiconductor (CMOS) device.

10. The memory device of claim 1, wherein the metal gate of the transistor includes titanium nitride.

11. The memory device of claim 1, wherein the memory device includes:
- a silicon region within an interlayer dielectric on which the dielectric is located contacting the interlayer dielectric in the memory array region;
- a polysilicon plug on and contacting the silicon region; and
- a digit line contact on and contacting the polysilicon plug arranged with the digit line on and contacting the digit line contact.

12. The memory device of claim 1, wherein the digit line contact includes multiple metals.

13. The memory device of claim 12, wherein the multiple metals include tungsten nitride, titanium, titanium nitride, or tungsten.

14. The memory device of claim 1, wherein the digit line has a top surface at a first level and the metal contact has a top surface at a second level, the second level being higher than the first level.

15. The memory device of claim 1, wherein the dielectric includes a silicon oxide or a silicon nitride.

16. A method of forming a memory device, the method comprising:
- forming a memory array region with a dielectric disposed in the memory array region;
- forming a digit line contacting the dielectric or contacting a region having at most one metallic region positioned on and contacting the dielectric, the digit line having a metal composition;
- forming a high-k metal gate of a transistor in a periphery to the memory array region; and
- forming a metal contact contacting the high-k metal gate of the transistor or contacting a region having at most one metal barrier region, the at most one metal barrier region above and contacting the high-k metal gate, the metal contact having the metal composition of the digit line, with a region between and including the metal contact to a high-k dielectric of the high-k metal gate composed of only conductive metallic materials.

17. The method of claim 16, wherein the method includes forming digit line contacts arranged in a pattern for a memory array of the memory array region, the digit line contacts provided for the digit line.

18. The method of claim 16, wherein the method includes:
- forming sacrificial polysilicon on the high-k metal gate, providing a protective layer to the high-k metal gate during processing of digit line contacts in a pattern in the dielectric in the memory array region; and
- removing the sacrificial polysilicon from the high-k metal gate prior to forming the digit line and the metal contact.

19. The method of claim 16, wherein the method includes:
- forming the digit line and the metal contact using tungsten;
- forming the at most one metallic region by forming tungsten silicide extending above and from a top level of the dielectric; and
- forming the at most one metal barrier region by forming tungsten silicide extending above and from a top level of the high-k metal gate.

20. The method of claim 16, wherein the method includes:
- forming the digit line by forming a tungsten digit line directly on and extending above a top level of the dielectric; and
- forming the metal contact by forming a tungsten metal contact directly on and extending above a top level of the high-k metal gate.

* * * * *